(12) United States Patent
Raffo et al.

(10) Patent No.: US 12,368,374 B2
(45) Date of Patent: Jul. 22, 2025

(54) PROTECTING A POWER INVERTER BY SENSING A PHASE NODE VOLTAGE

(71) Applicant: Infineon Technologies Austria AG, Villach (AT)

(72) Inventors: Diego Raffo, Redondo Beach, CA (US); Weidong Chu, San Pedro, CA (US); Christian Locatelli, Pavia (IT)

(73) Assignee: Infineon Technologies Austria AG, Villach (AT)

( * ) Notice: Subject to any disclaimer, the term of this patent is extended or adjusted under 35 U.S.C. 154(b) by 199 days.

(21) Appl. No.: 18/356,086

(22) Filed: Jul. 20, 2023

(65) Prior Publication Data
US 2025/0030335 A1    Jan. 23, 2025

(51) Int. Cl.
| | |
|---|---|
| H02M 1/32 | (2007.01) |
| G01R 31/26 | (2020.01) |
| H02M 1/088 | (2006.01) |
| H02M 1/36 | (2007.01) |
| H02M 7/539 | (2006.01) |
| H02P 27/08 | (2006.01) |

(52) U.S. Cl.
CPC ........ *H02M 1/325* (2021.05); *G01R 31/2608* (2013.01); *G01R 31/2621* (2013.01); *H02M 1/088* (2013.01); *H02M 1/36* (2013.01); *H02M 7/539* (2013.01); *H02P 27/08* (2013.01)

(58) Field of Classification Search
CPC ........... G01R 31/2608; G01R 31/2621; H02M 1/325; H02M 1/088; H02M 1/08; H02M 1/36; H02M 7/539; H02P 27/08
See application file for complete search history.

(56) References Cited

U.S. PATENT DOCUMENTS

| | | | |
|---|---|---|---|
| 10,461,730 B1 * | 10/2019 | Mariconti | ............ H03K 17/168 |
| 2019/0245534 A1 * | 8/2019 | Takayama | ............ H03K 17/162 |
| 2024/0372460 A1 * | 11/2024 | Nakajima | ............... H02M 1/08 |

* cited by examiner

*Primary Examiner* — Judy Nguyen
*Assistant Examiner* — Adam S Clarke
(74) *Attorney, Agent, or Firm* — Harrity & Harrity, LLP

(57) ABSTRACT

A monolithic half-bridge gate driver includes a phase node terminal configured to be coupled to a phase node to which a high-side transistor and a low-side transistor of a half-bridge are coupled; a diode comprising an anode and a cathode, wherein the cathode is coupled to the phase node terminal; and a comparator comprising a first input terminal coupled to the anode of the diode for receiving a measurement value indicative of a phase voltage at the phase node terminal, a second input terminal coupled to a threshold source for receiving a threshold, and an output terminal configured to output a comparison result indicating whether the measurement value satisfies the threshold. The phase node terminal is configured to be connected to a high-side supply potential by the high-side transistor, and is configured to be connected to a low-side supply potential by the low-side transistor.

21 Claims, 7 Drawing Sheets

| Diagnosis | Status | LIN | LO-COM | VS-COM | DESAT NMOS_L | VDES_L-COM |
|---|---|---|---|---|---|---|
| On state diagnosis | Low-side normal operation | HIGH | HIGH | LOW | OFF | < Vth2 |
| | | LOW | LOW | - | ON | < Vth2 |
| | First fault operating condition | HIGH | HIGH | HIGH | OFF | ≥ Vth2 |

FIG. 2B

| Diagnosis | Status | VCC | VS-COM | DESAT NMOS_L | VDES_L-COM | LO-COM | HO-VS |
|---|---|---|---|---|---|---|---|
| On state diagnosis | VS node sense time | >UVLO | - | OFF | - | 0 | 0 |
| | Second Fault operating condition | >UVLO | LOW | OFF | < Vth2 | 0 | 0 |
| | Ready for normal operation | >UVLO | HIGH | - | ≥ Vth2 | - | - |

FIG. 2D

| Diagnosis | Status | HIN | HO - VS | VS - COM | Output of inverter VND-VS | VND-COM | VDES_H - COM |
|---|---|---|---|---|---|---|---|
| On state diagnosis | High side normal operation | HIGH HO=VB | HIGH | HIGH | LOW VND=VS | HIGH VDES_H is pulled high relative to COM by VND | ≥ Vth1 |
| | | LOW HO=VS | LOW | - | HIGH VND=VB | HIGH VDES_H is pulled high relative to COM by VND | ≥ Vth1 |
| | Third Fault operating condition | HIGH HO=VB VS~COM | HIGH | LOW VS~COM | LOW VND=VS VS~COM | LOW VDES_H is pulled low by VND because reference supply voltage of logic inverter is VS and VS~COM during a fault. VDES_H is clamped to VF of bit transfer diode | < Vth1 |

FIG. 2F

PROTECTING A POWER INVERTER BY SENSING A PHASE NODE VOLTAGE

BACKGROUND

Many functions of modern devices in automotive, consumer, and industrial applications, such as driving an electric motor or an electric machine, rely on power semiconductor devices. For example, insulated gate bipolar transistors (IGBTs), metal oxide semiconductor field effect transistors (MOSFETs), and diodes, to name a few, have been used for various applications including, but not limited to, switches in power supplies and power converters.

A transistor typically comprises a semiconductor structure configured to conduct a load current along a load current path between two load terminal structures of the transistor. Further, the load current may be controlled by a control electrode, sometimes referred to as a gate electrode, of the transistor. For example, upon receiving a corresponding control signal from, for example, a gate driver, the control electrode may set its transistor in one of a conducting state or a blocking state. Accordingly, the semiconductor structure behaves like a switch with on and off states (i.e., conducting and blocking states, respectively).

Usually, a power inverter is composed of two complementary transistors (e.g., a high-side transistor and a low-side transistor) for driving a load. In some implementations, the power inverter is composed of two complementary transistors for each motor phase of a motor, where the two complementary transistors form a half-bridge to drive an output pad connected to a motor winding. A half-bridge gate driver, used for driving the two complementary transistors, may be supplied with a fixed positive voltage by a positive supply rail and a fixed negative voltage by a negative supply rail. The positive supply rail may be connected to the output pad via the high-side transistor of the two complementary transistors to supply load current to the motor winding, and the negative supply rail may be connected to the output pad via the low-side transistor of the two complementary transistors to sink load current from the motor winding. The two complementary transistors may be complementarily turned on and off to avoid cross-conduction.

Accordingly, the load current, also referred to as a phase current, may be controlled by driving the two complementary transistors. The amplitude of the control signal received from the gate driver for each transistor may be varied to drive the two complementary transistors between switching states. This, in turn, drives the load. For example, a gate-source voltage Vgs of a MOSFET is typically driven down to approximately zero to turn off the MOSFET and is typically driven to a maximum value to fully turn on the MOSFET. For this reason, the gate-source voltage Vgs may be referred to as a control voltage.

SUMMARY

In some implementations, a monolithic half-bridge gate driver includes a low-side output terminal configured to be coupled to a control terminal of a low-side transistor of a half-bridge and configured to output a low-side output signal in order to drive the low-side transistor between switching states; a high-side output terminal configured to be coupled to a control terminal of a high-side transistor of the half-bridge and configured to output a high-side output signal in order to drive the high-side transistor between switching states; a phase node terminal configured to be coupled to a phase node to which the high-side transistor and the low-side transistor are coupled, wherein the phase node terminal is configured to be connected to a high-side supply potential by the high-side transistor if the high-side transistor is turned on, and wherein the phase node terminal is configured to be connected to a low-side supply potential by the low-side transistor if the low-side transistor is turned on; a diode comprising an anode and a cathode, wherein the cathode is coupled to the phase node terminal; and a comparator comprising a first input terminal coupled to the anode of the diode for receiving a measurement value indicative of a phase voltage at the phase node terminal, a second input terminal coupled to a threshold source for receiving a threshold, and an output terminal configured to output a comparison result indicating whether the measurement value satisfies the threshold.

In some implementations, a monolithic half-bridge gate driver includes a low-side output terminal configured to be coupled to a control terminal of a low-side transistor of a half-bridge and configured to output a low-side output signal in order to drive the low-side transistor between respective switching states; a high-side output terminal configured to be coupled to a control terminal of a high-side transistor of the half-bridge and configured to output a high-side output signal in order to drive the high-side transistor between respective switching states; a phase node terminal configured to be coupled to a phase node to which the high-side transistor and the low-side transistor are coupled, wherein the phase node terminal is configured to be connected to a high-side supply potential by the high-side transistor if the high-side transistor is turned on, and wherein the phase node terminal is configured to be connected to a low-side supply potential by the low-side transistor if the low-side transistor is turned on; an inverter comprising an inverter input, an inverter output, a first supply terminal configured to receive a floating supply voltage, and a second supply terminal configured to receive a floating reference voltage, wherein the inverter input is coupled to the high-side output terminal and configured to receive the high-side output signal as an input signal, wherein the second supply terminal is coupled to the phase node terminal and is configured to receive a phase voltage at the phase node terminal as the floating reference voltage, wherein the inverter is configured to generate an inverter output signal at the inverter output based on the input signal, the floating supply voltage, and the floating reference voltage; a diode comprising an anode and a cathode, wherein the cathode is coupled to the inverter output for receiving the inverter output signal from the inverter output; and a comparator comprising a first input terminal coupled to the anode of the diode for receiving a measurement value representative of the inverter output signal, a second input terminal coupled to a threshold source for receiving a threshold, and an output terminal configured to output a comparison result indicating whether the measurement value satisfies the threshold.

In some implementations, a method for detecting a fault operating condition includes generating a low-side output signal in order to drive a low-side transistor of a half-bridge between respective switching states; generating a high-side output signal in order to drive a high-side transistor of the half-bridge between respective switching states, wherein the high-side transistor and the low-side transistor are coupled to a phase node terminal, wherein the phase node terminal is connected to a high-side supply potential by the high-side transistor if the high-side transistor is turned on, and the phase node terminal is connected to a low-side supply potential by the low-side transistor if the low-side transistor is turned on; providing the high-side output signal as an input signal to an inverter; providing a floating supply voltage to a first supply terminal of the inverter; providing a phase voltage generated at the phase node terminal as a floating reference voltage to a second supply terminal of the inverter; generating an inverter output signal by the inverter based on the input signal, the floating supply voltage, and the floating reference voltage; providing the inverter output signal to a cathode of a diode; and comparing a measurement value at an anode of the diode with a threshold to generate a comparison result that indicates whether the measurement value satisfies the threshold, wherein the measurement value is representative of the inverter output signal of the inverter, and wherein the comparison result indicates whether or not the fault operating condition is present during an on-state interval during which the high-side output signal sets the high-side transistor in an on-state.

In some implementations, a method for detecting a fault operating condition includes generating a low-side output signal in order to drive a low-side transistor of a half-bridge between respective switching states; generating a high-side output signal in order to drive a high-side transistor of a half-bridge between respective switching states, wherein the high-side transistor and the low-side transistor are coupled to a phase node terminal, wherein the phase node terminal is connected to a high-side supply potential by the high-side transistor if the high-side transistor is turned on, and the phase node terminal is connected to a low-side supply potential by the low-side transistor if the low-side transistor is turned on, wherein a voltage at the phase node terminal is a phase voltage; providing the phase voltage to a cathode of a diode; and comparing a measurement value at an anode of the diode with a threshold to generate a comparison result that indicates whether the measurement value satisfies the threshold, wherein the measurement value is representative of the phase voltage, and wherein the comparison result indicates whether or not the fault operating condition is present.

In some implementations, a monolithic half-bridge gate driver includes a low-side output terminal configured to be coupled to a control terminal of a low-side transistor of a half-bridge and configured to output a low-side output signal in order to drive the low-side transistor between respective switching states; a high-side output terminal configured to be coupled to a control terminal of a high-side transistor of the half-bridge and configured to output a high-side output signal in order to drive the high-side transistor between respective switching states; a phase node terminal configured to be coupled to a phase node to which the high-side transistor and the low-side transistor are coupled, wherein the phase node terminal is configured to be connected to a high-side supply potential by the high-side transistor if the high-side transistor is turned on, and wherein the phase node terminal is configured to be connected to a low-side supply potential by the low-side transistor if the low-side transistor is turned on; an inverter comprising an inverter input, an inverter output, a first supply terminal configured to receive a floating supply voltage, and a second supply terminal configured to receive a floating reference voltage, wherein the inverter input is coupled to the high-side output terminal and configured to receive the high-side output signal as an input signal, wherein the second supply terminal is coupled to the phase node terminal and is configured to receive a phase voltage at the phase node terminal as the floating reference voltage, wherein the inverter is configured to generate an inverter output signal at the inverter output based on the input signal, the floating supply voltage, and the floating reference voltage; a first diode comprising a first anode and a first cathode, wherein the first cathode is coupled to the inverter output for receiving the inverter output signal from the inverter output; a first comparator comprising a first input terminal coupled to the first anode of the first diode for receiving a first measurement value representative of the inverter output signal, a second input terminal coupled to a first threshold source for receiving a first threshold, and a first output terminal configured to output a first comparison result indicating whether the first measurement value satisfies the first threshold; a second diode comprising a second anode and a second cathode, wherein the second cathode is coupled to the phase node terminal; and a second comparator comprising a third input terminal coupled to the second anode of the second diode for receiving a second measurement value indicative of a phase voltage at the phase node terminal, a fourth input terminal coupled to a second threshold source for receiving a second threshold, and a second output terminal configured to output a second comparison result indicating whether the second measurement value satisfies the second threshold.

In some implementations, a method for detecting a plurality of fault operating conditions includes generating a low-side output signal in order to drive a low-side transistor of a half-bridge between respective switching states; generating a high-side output signal in order to drive a high-side transistor of the half-bridge between respective switching states, wherein the high-side transistor and the low-side transistor are coupled to a phase node terminal, wherein the phase node terminal is connected to a high-side supply potential by the high-side transistor if the high-side transistor is turned on, and the phase node terminal is connected to a low-side supply potential by the low-side transistor if the low-side transistor is turned on; providing the high-side output signal as an input signal to an inverter; providing a floating supply voltage to a first supply terminal of the inverter; providing a phase voltage generated at the phase node terminal as a floating reference voltage to a second supply terminal of the inverter; generating an inverter output signal by the inverter based on the input signal, the floating supply voltage, and the floating reference voltage; providing the inverter output signal to a first cathode of a first diode; comparing a first measurement value at a first anode of the first diode with a first threshold to generate a first comparison result that indicates whether the first measurement value satisfies the first threshold, wherein the first measurement value is representative of the inverter output signal of the inverter, and wherein the first comparison result indicates whether or not a first fault operating condition is present during an on-state interval during which the high-side output signal sets the high-side transistor in an on-state; providing the phase voltage to a second cathode of a second diode; and comparing a second measurement value at a second anode of the second diode with a second threshold to generate a second comparison result that indicates whether the second measurement value satisfies the second threshold, wherein the second measurement value is representative of the phase voltage, and wherein the second comparison result indicates whether or not a second fault operating condition is present.

BRIEF DESCRIPTION OF THE DRAWINGS

Implementations are described herein making reference to the appended drawings.

FIG. 2B is a truth table corresponding to monitoring for a first fault operating condition.

FIG. 2D is a truth table corresponding to monitoring for a second fault operating condition.

FIG. 2F is a truth table corresponding to monitoring for a third fault operating condition.

DETAILED DESCRIPTION

Figure 1:
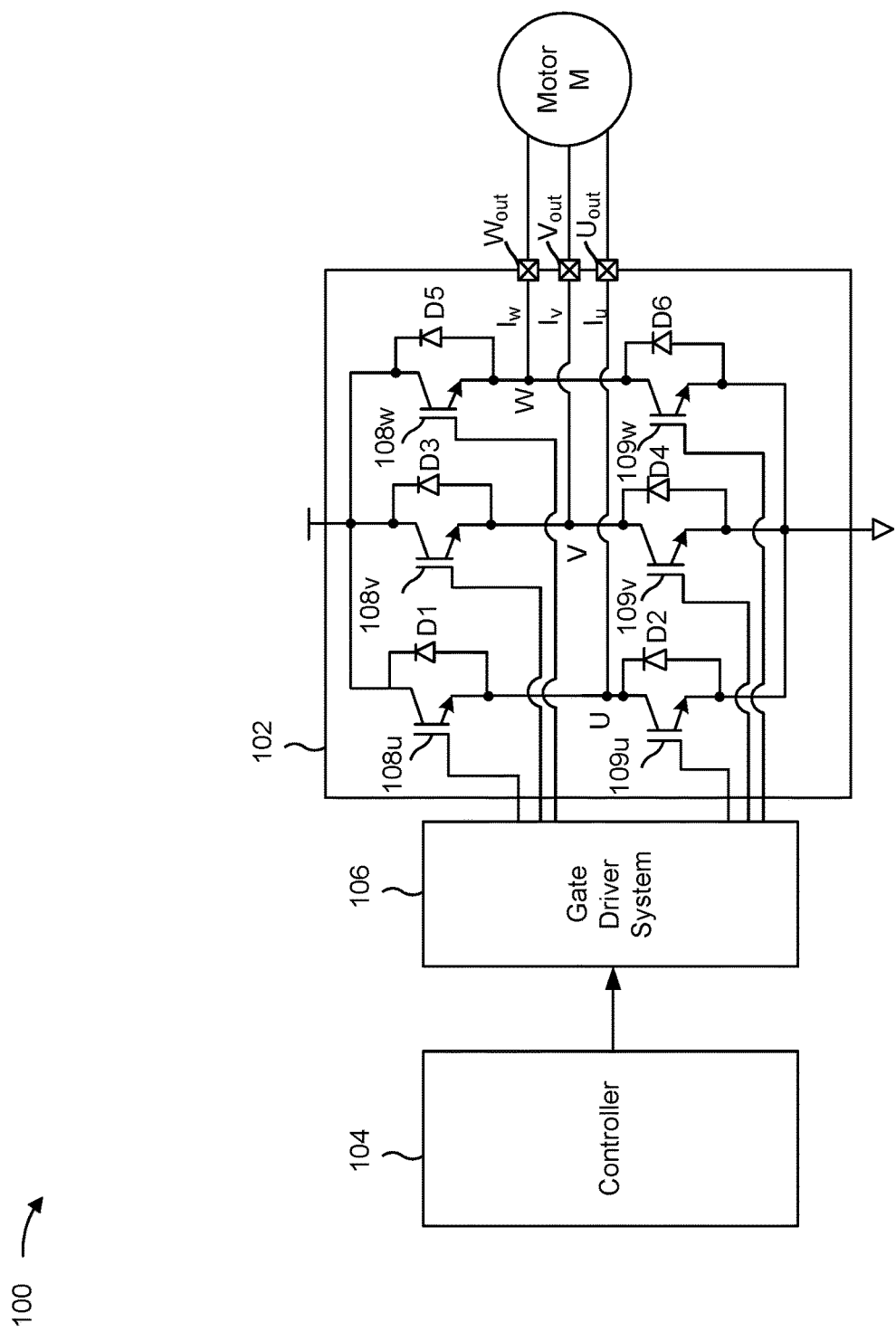
FIG. 1 illustrates a schematic block diagram illustrating a motor control system according to one or more implementations.

In the following, details are set forth to provide a more thorough explanation of example implementations. However, it will be apparent to those skilled in the art that these implementations may be practiced without these specific details. In other instances, well-known structures and devices are shown in block diagram form or in a schematic view, rather than in detail, in order to avoid obscuring the implementations. In addition, features of the different implementations described hereinafter may be combined with each other, unless specifically noted otherwise.

Further, equivalent or like elements or elements with equivalent or like functionality are denoted in the following description with equivalent or like reference numerals. As the same or functionally equivalent elements are given the same reference numbers in the figures, a repeated description for elements provided with the same reference numbers may be omitted. Hence, descriptions provided for elements having the same or like reference numbers are mutually interchangeable.

Each of the illustrated x-axis, y-axis, and z-axis is substantially perpendicular to the other two axes. In other words, the x-axis is substantially perpendicular to the y-axis and the z-axis, the y-axis is substantially perpendicular to the x-axis and the z-axis, and the z-axis is substantially perpendicular to the x-axis and the y-axis. In some cases, a single reference number is shown to refer to a surface, or fewer than all instances of a part may be labeled with all surfaces of that part. All instances of the part may include associated surfaces of that part despite not every surface being labeled.

The orientations of the various elements in the figures are shown as examples, and the illustrated examples may be rotated relative to the depicted orientations. The descriptions provided herein, and the claims that follow, pertain to any structures that have the described relationships between various features, regardless of whether the structures are in the particular orientation of the drawings, or are rotated relative to such orientation. Similarly, spatially relative terms, such as "top," "bottom," "below," "beneath," "lower," "above," "upper," "middle," "left," and "right," are used herein for ease of description to describe one element's relationship to one or more other elements as illustrated in the figures. The spatially relative terms are intended to encompass different orientations of the element, structure, and/or assembly in use or operation in addition to the orientations depicted in the figures. A structure and/or assembly may be otherwise oriented (rotated 90 degrees or at other orientations), and the spatially relative descriptors used herein may be interpreted accordingly. Furthermore, the cross-sectional views in the figures only show features within the planes of the cross-sections, and do not show materials behind the planes of the cross-sections, unless indicated otherwise, in order to simplify the drawings.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between," "adjacent" versus "directly adjacent," etc.).

In implementations described herein or shown in the drawings, any direct electrical connection or coupling (e.g., any connection or coupling without additional intervening elements) may also be implemented by an indirect connection or coupling (e.g., a connection or coupling with one or more additional intervening elements, or vice versa) as long as the general purpose of the connection or coupling (e.g., to transmit a certain kind of signal or to transmit a certain kind of information) is essentially maintained. Features from different implementations may be combined to form further implementations. For example, variations or modifications described with respect to one of the implementations may also be applicable to other implementations unless noted to the contrary.

As used herein, the terms "substantially" and "approximately" mean "within reasonable tolerances of manufacturing and measurement." For example, the terms "substantially" and "approximately" may be used herein to account for small manufacturing tolerances or other factors (e.g., within 5%) that are deemed acceptable in the industry without departing from the aspects of the implementations described herein. For example, a resistor with an approximate resistance value may practically have a resistance within 5% of the approximate resistance value. As another example, a signal with an approximate signal value may practically have a signal value within 5% of the approximate signal value.

In the present disclosure, expressions including ordinal numbers, such as "first", "second", and/or the like, may modify various elements. However, such elements are not limited by such expressions. For example, such expressions do not limit the sequence and/or importance of the elements. Instead, such expressions are used merely for the purpose of distinguishing an element from the other elements. For example, a first box and a second box indicate different boxes, although both are boxes. For further example, a first element could be termed a second element, and similarly, a second element could also be termed a first element without departing from the scope of the present disclosure.

A transistor can be referred to as a power switch, a logic switch, or a transistor switch that may be used to drive a current, such as a load current. In particular, a power transistor is a power semiconductor device that may be used to drive a load current. The power transistor includes a first load terminal (e.g., a source or an emitter) and a second load terminal (e.g., a drain or a collector). Additionally, a load current path of the power transistor may be controlled by a control electrode, sometimes referred to as a gate, connected to a control terminal of the power transistor. A load current path of the power transistor is a gate-controlled conductive channel whose conductivity may be controlled by a control voltage applied to the control electrode of the power transistor. For example, the power transistor can be turned on or off by activating and deactivating its control electrode. For example, applying a positive voltage across a gate and a source of a MOSFET will keep the MOSFET in its "on" state, while applying a voltage of approximately zero or slightly negative across the gate and the source of the MOSFET will cause the MOSFET to turn "off."

There is a turn-on process and a turn-off process for switching a transistor on and off. During the turn-on process of an n-channel transistor, a gate driver may be used to provide (source) a gate current (e.g., an ON current) to a gate of the n-channel transistor in order to charge a gate voltage to a sufficient voltage to turn on the n-channel transistor. In contrast, during the turn-off process of the n-channel transistor, the gate driver is used to draw (sink) a gate current (e.g., an OFF current) from the gate of the n-channel transistor in order to discharge the gate voltage sufficiently to turn off the n-channel transistor. A voltage pulse may be output from the gate driver as a control signal according to a pulse-width modulation (PWM) scheme. Thus, the control signal may be switched between an ON voltage level and an OFF voltage level during a PWM cycle for controlling the n-channel transistor. This in turn charges and discharges gate capacitance to correspondingly modulate the gate voltage to turn on and off the n-channel transistor, respectively.

The opposite is true for a p-channel transistor. The gate driver may be used to draw (sink) a gate current (e.g., an ON current) from a gate of the p-channel transistor in order to discharge the gate voltage to a sufficient voltage to turn on the p-channel transistor. In contrast, during the turn-off process of the p-channel transistor, the gate driver is used to provide (source) a gate current (e.g., an OFF current) to the gate of the p-channel transistor in order to charge the gate voltage of the p-channel transistor sufficiently to turn off the p-channel transistor. A control signal applied to the gate of the p-channel transistor may be switched between an ON voltage level and an OFF voltage level during a PWM cycle for controlling the p-channel transistor. This in turn charges and discharges the gate voltage to turn on and off the p-channel transistor, respectively.

For both n-channel and p-channel transistors, the n-channel and p-channel transistors are off when the gate-source voltage Vgs is approximately a zero value or below a threshold voltage and the n-channel and p-channel transistors are on when the gate-source voltage Vgs is equal to or greater than the threshold voltage.

For driving a load in this manner, two transistors are typically arranged in a half-bridge configuration and may form an inverter leg of a power inverter. The two transistors may include a high-side transistor and a low-side transistor that are coupled together at a phase node at which a phase voltage (e.g., a phase node voltage) is generated based on the switching states of the two transistors. The phase voltage is used to generate a phase current. The high-side transistor may be a p-channel transistor connected to a high-side supply potential and the low-side transistor may be an n-channel transistor connected to a low-side supply potential. In some implementations, the high-side transistor and the low-side transistor may be of a same transistor type (e.g., both n-channel type or both p-channel type).

A load current (e.g., the phase current) is said to be a positive load current when the load current is flowing from a half-bridge toward the load (e.g., flowing from the phase node toward the load), and a load current is said to be negative when the load current is flowing away from the load toward the half-bridge (e.g., toward the phase node from the load). A high-side transistor, when on, is responsible for conducting a positive load current in order to source the load current to the load while its complementary, low-side transistor is turned off (e.g., the low-side transistor is in blocking or high impedance mode). In order to sink load current from the load, the roles of the high-side and low-side transistors are reversed. Here, the low-side transistor, when on, is responsible for conducting a negative load current in order to sink the load current from the load while its complementary, high-side transistor is turned off (e.g., the high-side transistor is in blocking or high impedance mode). The two complementary transistors are typically switched such that both are not turned on at the same time.

Transistors may include IGBTs and MOSFETs (e.g., Si MOSFETs or SiC MOSFETs), among other examples. It will be appreciated that one type of transistor may be substituted for another type of transistor. In this context, when substituting a MOSFET for an IGBT, the MOSFET's drain may be substituted for the IGBT's collector, the MOSFET's source may be substituted for the IGBT's emitter, the MOSFETs drain-source voltage Vds may be substituted for the IGBT's collector-emitter voltage Vce, and the MOSFET's gate-source voltage Vgs may be substituted for the IGBT's gate-emitter voltage Vge, or vice versa, in any one of the examples described herein.

Some implementations described in this disclosure pertain to, without being limited thereto, half-bridges used for driving electric motors. For example, a multi-phase inverter, as a type of power inverter, is configured to provide multi-phase power by supplying multiple phase loads (e.g., a three-phase motor). For instance, three-phase power involves three symmetrical sine waves that are 120 electrical degrees out of phase with one another. In a symmetric three-phase power supply system, three conductors each carry an alternating current (AC) of the same frequency and voltage amplitude relative to a common reference but with a phase difference of one third of a driving cycle. Due to the phase difference, a voltage on any of the three conductors reaches its voltage peak at one third of the driving cycle, with the voltage peaks of the three conductors being distributed from each other within the driving cycle with a substantially equal phase delay. This phase delay gives constant power transfer to a balanced linear load. It also makes it possible to produce a rotating magnetic field in an electric motor.

A three-phase inverter includes three inverter legs, one for each of the three phases, and each inverter leg is connected to a direct current (DC) voltage source in parallel to each other. Each inverter leg includes a pair of transistors arranged in a half-bridge configuration for converting DC to AC, for driving a phase load, as described above. However, multi-phase inverters are not limited to three phases, and may include two phases or more than three phases, with an inverter leg for each phase. In some instances, two half-bridges may be connected as an H-bridge circuit with the load (e.g., the motor) connected as a crossbar between the two half-bridges as a single-phase load.

Simple power inverter stages typical of low power motor drive systems, such as motor drive systems for refrigerators, are very cost sensitive. As a result, some manufacturers are not implementing any over-current or short circuit protection within the power inverter stage (e.g., within a gate driver of the power inverter stage). Instead, some manufacturers rely on a transistor's short circuit capability (e.g., an IGBT's short circuit capability) and a fuse placed on an AC line in order to guarantee required safety. However, a new generation of IGBTs have less short circuit withstanding time and new packages introduced recently, such as small outline transistor (SOT) packages (e.g., SOT-223), are smaller and have a reduced thermal mass. As a result, it is becoming more difficult to implement protection that relies on the transistor's short circuit capability in conjunction with using only a fuse on the AC line.

Some implementations disclosed herein are directed to a half-bridge gate driver that is configured to sense a phase node of an inverter leg with a certain timing in comparison with gate driver input/output signals. For example, the half-bridge gate driver may be configured to monitor for and detect a first fault operating condition by sensing the phase voltage at the phase node while the low-side transistor is on (and the high-side transistor is off), and comparing the phase voltage with a first threshold. As another example, the half-bridge gate driver may be configured to monitor for and detect a second fault operating condition by sensing the phase voltage at the phase node while the high-side transistor is on (and the low-side transistor is off), and comparing the phase voltage with a second threshold. As another example, the half-bridge gate driver maybe configured to monitor for and detect a third fault operating condition by sensing the phase voltage at the phase node during a start-up sequence of the half-bridge gate driver, during which the low-side transistor and the high-side transistor are both off, and comparing the phase voltage to a third threshold.

In some implementations, the half-bridge gate driver may be a monolithic half-bridge gate driver. By integrating the monitoring and detection circuitry monolithically onto the half-bridge gate driver, it may be possible to reduce an amount of space and cost required to monitor for the first, the second, and/or the third fault operating conditions.

Thus, the half-bridge gate driver may provide a solution for protecting systems that use a new generation of power transistor devices that have smaller short circuit capability and smaller thermal mass. Additionally, the half-bridge gate driver may be particularly attractive since the half-bridge gate driver can be implemented using a small and simple 8-pin package that is already popular in low-power applications. Thus, the half-bridge gate driver may be capable of monitoring for the first, the second, and/or the third fault operating conditions without increasing a quantity of pins of a gate driver package, which is beneficial for saving manufacturing costs and for integration into current systems.

FIG. 1 illustrates a schematic block diagram illustrating a motor control system 100 according to one or more implementations. In particular, the motor control system 100 includes a power inverter 102, a controller 104, and a gate driver system 106. The controller 104 and the gate driver system 106 operate together as a motor control unit. In some implementations, the motor control unit may be a monolithic integrated circuit (IC) with the controller 104 and the gate driver system 106 being arranged on a single IC. "Monolithic" refers to a type of IC or semiconductor device that is fabricated on a single chip of a single material, typically silicon. The IC is called "monolithic" because all the active and passive components of the circuit, such as transistors, resistors, capacitors, and interconnects, are integrated onto a single piece or substrate of material. In some implementations, the motor control unit may be divided into two or more ICs, for example, with the controller 104 being arranged on a first IC and the gate driver system 106 being arranged on one or more second ICs. Thus, the gate driver system 106 may be a monolithic gate driver. It will be appreciated that, while implementations described herein are directed to driving a motor, the concepts described herein may be extended to other types of inductive loads and are not limited to motors.

The motor control system 100 is further coupled to a motor M (e.g., a permanent magnet synchronous motor (PMSM) as a type of AC motor), that includes three phases U, V, and W. The power inverter 102 in this example is a three-phase voltage generator configured to provide three-phase power by supplying three phase voltages to drive the motor M.

Deviations in both magnitude and phase may cause a loss in power and torque in the motor M. Therefore, the controller 104 may be configured to monitor and control the magnitude and phase of the voltages supplied to the motor M in real-time to ensure that the proper current balance is maintained based on a feedback control loop.

The power inverter 102 for the motor M includes a switching array of six transistors 108$u$, 108$v$, 108$w$, 109$u$, 109$v$, and 109$w$ arranged in complementary pairs. Each complementary pair forms a half-bridge circuit and constitutes one inverter leg that supplies a phase voltage to the motor M. Thus, each inverter leg includes a high-side transistor 108$u$, 108$v$, or 108$w$ and a low-side transistor 109$u$, 109$v$, or 109$w$. Additionally, each transistor 108$u$, 108$v$, 108$w$, 109$u$, 109$v$, and 109$w$ may be connected antiparallel to a corresponding freewheeling diode D1-D6. The freewheeling diodes D1-D6 provide an alternative current path for the load current during turn off of a respective transistor 108$u$, 108$v$, 108$w$, 109$u$, 109$v$, and 109$w$ for current commutation. For example, the freewheeling diode D1 provides an alternative current path with respect to the low-side transistor 109$u$ during the turn off of the low-side transistor 109$u$. Similarly, the freewheeling diode D2 provides an alternative current path with respect to the high-side transistor 108$u$ during the turn off of the high-side transistor 108$u$.

Load current paths U, V, and W extend from an output pad Uout, Vout, or Wout of each inverter leg (e.g., the output of each half-bridge circuit) located between complementary transistors and are configured to be coupled to a load, such as the motor M. Each load current path U, V, and W carries a corresponding phase current Iu, Iv, and Iw. Each phase current Iu, Iv, and Iw has an AC electrical frequency that directly corresponds to the actual motor speed of the motor M.

The power inverter 102 is coupled to a DC power supply (e.g., a battery or a diode bridge rectifier) and to the gate driver system 106.

The controller 104, which may be a microcontroller or another hardware-based controller, performs a motor control function of the motor control system 100 in real-time (or near real-time) and transmits PWM control signals to a gate driver system 106. The controller 104 may employ a PWM scheme for controlling the state of each transistor, and, ultimately, each phase current provided on the respective load current paths U, V, and W. The gate driver system 106 generates driver signals based on the PWM control signals for controlling the switching states (e.g., on and off states) of the transistors 108$u$, 108$v$, 108$w$, 109$u$, 109$v$, and 109$w$. Thus, load current paths U, V, and W may be controlled by the controller 104 and the gate driver system 106 by controlling the control electrodes (e.g., gate electrodes) of the transistors 108$u$, 108$v$, 108$w$, 109$u$, 109$v$, and 109$w$. For example, upon receiving a PWM control signal from the controller 104, the gate driver system 106 may set a corresponding transistor 108$u$, 108$v$, 108$w$, 109$u$, 109$v$, or 109$w$ in one of a conducting state (e.g., on-state) or a blocking state (e.g., off-state).

The gate driver system 106 may include one or more gate drivers for driving the transistors 108$u$, 108$v$, 108$w$, 109$u$, 109$v$, and 109$w$ between switching states. For example, the gate driver system 106 may include a gate driver for each half-bridge circuit. The gate driver system 106 may be configured to receive instructions, including the PWM control signals, from the controller 104, and respectively turn on and turn off the transistors 108u, 108v, 108w, 109u, 109v, and 109w in accordance with the received instructions and the control signals. For example, during the turn-on process of a transistor 108u, 108v, 108w, 109u, 109v, or 109w, the gate driver system 106 may be used to provide (source) a gate current to a gate of the transistor 108u. 108v, 108w, 109u, 109v, or 109w to charge the gate. In contrast, during the turn-off process, the gate driver system 106 may be used to draw (sink) a gate current from the gate of the transistor 108u, 108v, 108w, 109u, 109v, or 109w to discharge the gate.

Furthermore, the transistors 108u, 108v, 108w, 109u, 109v, and 109w of the power inverter 102 are controlled so that at no time are both high-side and low-side transistors in the same inverter leg turned on, or else the DC power supply would be shorted. This requirement may be met by the complementary operation of the transistors 108u, 108v, 108w, 109u, 109v, and 109w within an inverter leg according to a motor control algorithm. For example, during operation, the motor M may be driven according to the motor control algorithm to achieve a desired motor speed corresponding to an electrical frequency of the control signals. A dead time may be imposed by the controller 104 during which both the high-side and low-side transistors of the same inverter leg are simultaneously turned off.

As indicated above, FIG. 1 is provided merely as an example. Other examples may differ from what is described with regard to FIG. 1. For example, in some implementations, a number of motor phases may be different or two half-bridges may be connected as an H-bridge circuit. In some implementations, additional circuit components may be added without deviating from the disclosure provided above.

Figure 2A:
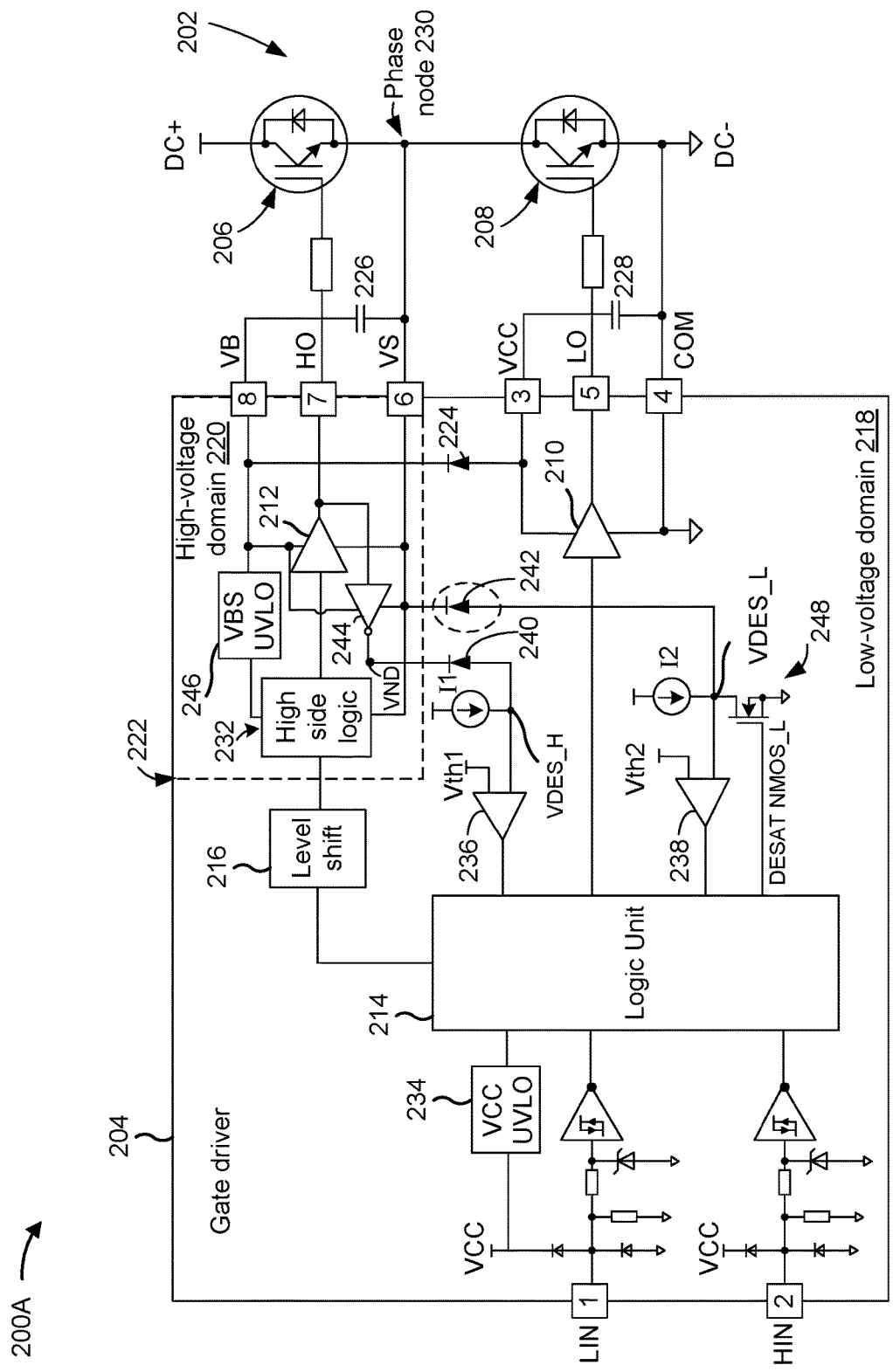
FIG. 2A illustrates a schematic block diagram of a gate driver system according to one or more implementations.

FIG. 2A illustrates a schematic block diagram of a gate driver system 200A according to one or more implementations. The gate driver system 200A may correspond to the gate driver system 106 of FIG. 1. As shown in FIG. 2, the gate driver system 200A includes a single-phase motor drive stage 202 (e.g., an inverter leg or a half-bridge circuit) and a half-bridge gate driver 204 electrically coupled to the single-phase motor drive stage 202. The gate driver system 200A can be duplicated for each inverter leg in the gate driver system 200.

The single-phase motor drive stage 202 includes a high-side transistor 206 and a low-side transistor 208 that are controlled for supplying a load current $I_{LOAD}$ to the motor M. In other words, the single-phase motor drive stage 202 in this example corresponds to one of the phase inverter legs of the motor M described in connection with FIG. 1.

The half-bridge gate driver 204 may be a monolithic half-bridge gate driver that includes a low-side gate driver 210 used to drive the low-side transistor 208 and a high-side gate driver 212 used to drive the high-side transistor 206. Both the low-side and the high-side gate drivers 210 and 212 may perform gate driving of their respective low-side transistor 208 and high-side transistor 206 based on the PWM control signals LIN and HIN received from a PWM controller, such as the controller 104. The PWM control signal LIN may be used by the low-side gate driver 210 to control a switching state of the low-side transistor 208. The PWM control signal HIN may be used by the high-side gate driver 212 to control a switching state of the high-side transistor 206.

The half-bridge gate driver 204 may include a package that includes a plurality of terminals 1-8 (e.g., 8 pins) that are used as input terminals (e.g., for receiving control signals or supply voltages) and output terminals (e.g., for providing drive signals or gate control signals). The PWM control signals LIN and HIN may be received from the controller 104 at control terminals 1 and 2 of the half-bridge gate driver 204, respectively, and may be provided to a logic unit 214. The logic unit 214 may include one or more processors and/or logic circuitry that may be configured to perform signal processing, logic control, filtering, fault detection, dead time control, and operate in one or more evaluation modes based on one or more conditions being satisfied. For example, the logic unit 214 may be configured to receive the PWM control signals LIN and HIN from the controller 104 and ensure that there is a minimum dead time implemented, during which both the high-side transistor 206 and the low-side transistor 208 are simultaneously turned off.

The PWM control signals LIN and HIN are passed on to the respective low-side and high-side gate drivers 210 and 212 by the logic unit 214. In some implementations, the PWM control signal HIN, provided to the high-side gate driver 212, may be passed through a level shifter 216. The level shifter 216 may be used to convert (e.g., level shift) the PWM control signal HIN, and thus transfer control information from a low-voltage domain to a high-voltage domain of the half-bridge gate driver 204. After this point, the low-side and the high-side gate drivers 210 and 212 perform gate driving.

The half-bridge gate driver 204 may be a multi-voltage domain device that includes a low-side region 218 comprising first circuitry that operates in the low-voltage domain, a high-side region 220 comprising second circuitry that operates in the high-voltage domain, and an isolation region 222 that electrically isolates the low-side region 218 and the high-side region 220. For example, the low-voltage domain and the high-voltage domain may have different ground potentials. For example, the low-voltage domain may have a first ground potential (e.g., 0V or COM) and the high-voltage domain may have a second ground potential (e.g., a floating ground potential) that is different from the first ground potential. For example, the second ground potential may be greater than the first ground potential and, as a result, the high-voltage domain may be referred to as the higher voltage domain.

The low-side and high-side gate drivers 210 and 212 are configured to receive the PWM control signals LIN and HIN signals and, based thereon, control the on/off state of the low-side transistor 208 and the high-side transistor 206. Thus, the half-bridge gate driver 204 may be configured to receive PWM control signals LIN and HIN from the controller 104 and turn on or turn off respective high-side and low-side transistors 206 and 208 in accordance with the received PWM control signals LIN and HIN. For example, during the turn-on process of one of the high-side and low-side transistors 206 and 208, the half-bridge gate driver 204 may be used to provide (source) a gate current to the gate of one of the high-side transistor 206 or the low-side transistor 208 to charge the gate. In contrast, during the turn-off process of one of the high-side and low-side transistors 206 and 208, the half-bridge gate driver 204 may be used to draw (sink) a gate current from the gate of one of the high-side transistor 206 or the low-side transistor 208 to discharge the gate.

Thus, the controller 104 is electrically coupled to the half-bridge gate driver 204 for the transmission of information and control signals therebetween, and the half-bridge gate driver 204 is electrically coupled to the single-phase motor drive stage 202 for driving the high-side and low-side transistors 206 and 208.

The half-bridge gate driver 204 may further include a bootstrap diode 224 to charge a voltage charging device 226. In this case, the voltage charging device 226 may be a bootstrap capacitor. However, the voltage charging device 226 may be a chargeable battery or another type of voltage charging device. The voltage charging device 226 may be charged through a connection to a low-side fixed supply voltage VCC.

In FIG. 2, VB refers to a high-side floating supply voltage; VS refers to a phase voltage that may be used as a high-side floating ground voltage or a high-side reference voltage; VCC refers to the low-side fixed supply voltage; COM refers to a low-side ground voltage or a low-side reference voltage; HO refers to an output terminal for a high-side output signal (e.g., a high-side floating output voltage) configured to control the high-side transistor 206; LO refers to an output terminal for a low-side output signal (e.g., a low-side output voltage) configured to control the low-side transistor 208; DC+ refers to a DC-link positive supply (e.g., a high-side supply potential); DC− refers to a DC-link negative supply (e.g., low-side supply potential), such as ground or a negative potential, and is connected to COM; and HIN and LIN refer to the PWM control signals (e.g., logic input voltages) received from the controller 104.

The low-side fixed supply voltage VCC may provide power to certain logic components of the half-bridge gate driver 204 that use a fixed supply voltage to operate and may be used to charge the voltage charging device 226 when the bootstrap diode 224 is forward biased. For example, the low-side fixed supply voltage VCC may provide power to the circuitry located in the low-side region 218 (e.g., in the low-voltage domain). Similarly, the low-side ground voltage COM may be used as a reference potential for the circuitry located in the low-side region 218. Thus, the logic components located in the low-side region 218 may have one supply terminal configured to receive the low-side fixed supply voltage VCC and another supply terminal configured to receive the low-side ground voltage COM for providing power to the logic components.

The high-side floating supply voltage VB may provide power to the circuitry located in the high-side region 220 (e.g., the high-voltage domain) and the phase voltage VS may be used as a reference potential (e.g., the high-side floating reference voltage) for the circuitry located in the high-voltage domain. For example, logic components located in the high-side region 220 may have one supply terminal configured to receive the high-side floating supply voltage VB and another supply terminal configured to receive the phase voltage VS as the high-side floating reference voltage for providing power to the logic components.

The half-bridge gate driver 204 may include a fixed power supply terminal 3 coupled to a power supply for receiving the low-side fixed supply voltage VCC. The power supply terminal 3 may be configured to be charged to the low-side fixed supply voltage VCC (e.g., a power supply potential) provided by the power supply during a start-up operation or a reset operation of the half-bridge gate driver 204. For example, the power supply terminal 3 may be charged to the low-side fixed supply voltage VCC using a voltage charging device 228 during the start-up operation or the reset operation of the half-bridge gate driver 204.

The half-bridge gate driver 204 may include a common terminal 4 coupled to COM and the DC-link negative supply DC−.

The half-bridge gate driver 204 may include a low-side output terminal 5 configured to output the low-side output signal LO, which is a control signal used for controlling the low-side transistor 208.

The half-bridge gate driver 204 may include phase node terminal 6 coupled to the phase voltage VS. In particular, the phase voltage VS may be generated at the phase node 230 of the single-phase motor drive stage 202. For example, the phase node 230 may be coupled to the high-side transistor 206 and the low-side transistor 208. The phase node terminal 6 may be configured to be connected to the high-side supply potential provided by the DC-link positive supply DC+ by the high-side transistor 206 when the high-side transistor 206 is turned on. Alternatively, the phase node terminal 6 may be configured to be connected to the low-side supply potential provided by the DC-link negative supply DC− by the low-side transistor 208 when the low-side transistor is turned on 208.

The half-bridge gate driver 204 may include a high-side output terminal 7 configured to output the high-side output signal HO, which is a control signal used for controlling the high-side transistor 206.

The half-bridge gate driver 204 may include a floating power supply terminal 8 coupled to the voltage charging device 226 in order to receive the high-side floating supply voltage VB and provide the high-side floating supply voltage VB to the circuitry located in the high-voltage domain.

The high-side floating supply voltage VB may equal VCC−VS−VD, where VD is a forward bias voltage drop across the bootstrap diode 224. As one example implementation, when the low-side fixed supply voltage VCC is equal to 15 V and the high-side floating ground voltage VS is equal to 0V, and the bootstrap diode 224 is forward biased and has a forward bias voltage drop of VD=0.5 V, then VB=15 V−0 V−0.5 V=14.5 V. That is, during normal operation, the high-side floating supply voltage VB is about 15 V above the high-side floating ground voltage VS due to the voltage charging device 226 supplying to a high-side of the half-bridge gate driver 204. A positive power supply rail that provides the DC-link positive supply DC+ may be in the range of 100-1200 V, for example, but is not limited thereto. On top of this, the high-side floating ground voltage VS is equal to DC− (e.g., COM or 0 V) when low-side transistor 208 is on (and high-side transistor 206 is off). A negative power supply rail provides the DC-link negative supply DC− and may be shorted to COM, as shown, but need not be. In this case, the high-side floating supply voltage VB is near 15 V and the voltage charging device 226 is charged by the low-side fixed supply voltage VCC through the bootstrap diode 224. Otherwise, the high-side floating ground voltage VS is equal to the DC-link positive supply DC+ when the high-side transistor 206 is on (and low-side transistor 208 is off) and the bootstrap diode 224 is reverse biased and non-conducting. In the case where the bootstrap diode 224 is reverse biased, the high-side floating supply voltage VB is 15 V above the DC-link positive supply DC+ and the voltage charging device 226 is slowly discharging. It will be appreciated that certain circuit values and device parameters used herein serve as examples for illustrative purposes for one or more possible implementations out of many possible implementations and are not to be treated as limiting or required in any way unless explicitly stated.

The aforementioned voltages are set such that a high-side voltage domain of the half-bridge gate driver 204 operates in a higher voltage or domain than that of a low-side voltage domain of the half-bridge gate driver 204. For example, the low-side fixed supply voltage VCC may be set to 15 V and the high-side floating supply voltage VB may be operated at a maximum voltage of 115 V when the DC-link positive supply DC+ is supplied at 100 V.

The half-bridge gate driver 204 may be configured to receive instructions from the controller 104 to drive a motor phase (e.g., single-phase motor drive stage 202) connected to the high-side floating ground voltage VS using the PWM control signals. These PWM control signals, depicted as PWM control signals HIN and LIN, are received by the half-bridge gate driver 204 and passed through to the high-side gate driver 212 and the low-side gate driver 210 via the appropriate logic (e.g., the logic unit 214 for the low-side gate driver 210 and the level shifter 216 for the high-side gate driver 212). The low-side gate driver 210 may be configured to receive the PWM control signal LIN and the high-side gate driver 212 may configured to receive the PWM control signal HIN through high-side logic 232 and drive the low-side transistor 208 and the high-side transistor 206, respectively, using output terminals HO and LO of the half-bridge gate driver 204.

The half-bridge gate driver 204 may further include a VCC under-voltage lockout (UVLO) circuit 234, a first comparator 236, a second comparator 238, a bit transfer diode 240, a desaturation (DESAT) diode 242, a logic inverter 244, a VBS UVLO circuit 246, a current source I1, and a blanking circuit 248. The current source I1 may be used to forward bias the bit transfer diode 240.

The half-bridge gate driver 204 may be configured to monitor for and detect a first fault operating condition, such as a low-side desaturation fault condition. The first fault operating condition may occur when the low-side output signal LO is high (e.g., the PWM control signal LIN is high), the low-side transistor 208 is on, and the phase node 230 is shorted to DC+ or some other potential corresponding to the high-side region 220, causing the phase voltage VS to be higher than expected. In other words, under a normal operating condition, the phase voltage VS should be pulled towards DC− and should be close to the low-side supply potential (e.g., the phase voltage VS should differ from the low-side supply potential according to a voltage drop across the low-side transistor 208).

The low-side output terminal 5 and the second comparator 238 are arranged in the low-side region 218, the high-side output terminal 7 and the phase node terminal 6 are arranged in the high-side region 220, and the DESAT diode 242 is coupled to the first circuitry of the low-side region 218 and to the second circuitry of the high-side region 220. In some implementations, the DESAT diode 242 may be arranged in the low-side region 218. In some implementations, the DESAT diode 242 may be arranged in the isolation region 222.

The DESAT diode 242 includes an anode and a cathode. The cathode is coupled to the phase node terminal 6 and the anode is coupled to a first input terminal of the second comparator 238. Thus, the cathode of the DESAT diode 242 is coupled to the phase voltage VS. A measurement value VDES_L is provided at the anode of the DESAT diode 242 based on the phase voltage VS. For example, the measurement value VDES_L may be clamped to the phase voltage VS plus the forward voltage VF of the DESAT diode 242 (e.g., VDES_L=VS+VF). Thus, the measurement value VDES_L may be representative of the phase voltage VS at the phase node terminal 6.

The second comparator 238 includes a second input terminal coupled to a threshold source for receiving a threshold Vth2. The threshold Vth2 may be generated internally by the half-bridge gate driver 204, for example, by the logic unit 214 based on VCC and a programmable voltage divider.

The second comparator 238 further includes an output terminal coupled to the logic unit 214. The second comparator 238 may be configured to compare the values at its two input terminals (e.g., the measurement value VDES_L with the threshold Vth2) and output a comparison result indicating whether the measurement value VDES_L satisfies the threshold Vth2. In other words, the comparison result of the second comparator 238 may indicate whether or not the first fault operating condition is present. In some implementations, the measurement value VDES_L may satisfy the threshold Vth2 when the measurement value VDES_L is greater than the threshold Vth2. The logic unit 214 may refer to the PWM control signal LIN to determine when the low-side transistor 208 is on, and may monitor the comparison result of the second comparator 238 when the low-side transistor 208 is on.

Under the normal operating condition corresponding to a no-fault condition, if the low-side output signal LO is configured to set the low-side transistor 208 an on-state and the high-side output signal HO is configured to set the high-side transistor 206 in an off-state: the phase voltage VS at the phase node terminal 6 is configured to be pulled toward the low-side supply potential, the measurement value VDES_L is pulled to be less than the threshold Vth2 by the phase voltage VS, and the comparison result of the second comparator 238 should indicate that the measurement value VDES_L does not satisfy the threshold, thereby indicating the normal operating condition.

Under the normal operating condition, if the low-side output signal LO is configured to set the low-side transistor 208 in the on-state and the high-side output signal HO is configured to set the high-side transistor 206 in the off-state: the measurement value VDES_L may be clamped to a difference between a forward voltage VF of the DESAT diode 242 and a voltage drop across the low-side transistor 208. The difference should be less than the threshold Vth2.

In contrast, under the first fault operating condition, if the low-side output signal LO is configured to set the low-side transistor 208 in an on-state and the high-side output signal HO is configured to set the high-side transistor 206 in an off-state: the phase voltage VS at the phase node terminal 6 may be pulled toward the high-side supply potential provided by the DC-link positive supply DC+. As a result, the measurement value VDES_L is pulled to be greater than the threshold Vth2 by the phase voltage VS, and the comparison result of the second comparator 238 indicates that the measurement value VDES_L satisfies the threshold Vth2, thereby indicating that the first fault operating condition is present. The logic unit 214 may turn off the low-side transistor 208 in response to detecting the first fault operating condition in order to prevent damage to the gate driver system 200A.

The blanking circuit 248 may include a DESAT transistor DESAT NMOS_L and a current source I2. The current source I2 may be used to forward bias the DESAT diode 242. The DESAT transistor DESAT NMOS_L may be controlled by the logic unit 214. When the DESAT transistor DESAT NMOS_L is turned on, the measurement value VDES_L is pulled low to COM, which effectively deactivates the monitoring for the first fault operating condition. When the DESAT transistor DESAT NMOS_L is turned off, the measurement value VDES_L is controlled by the phase voltage VS.

As indicated above, FIG. 2A is provided merely as an example. Other examples may differ from what is described with regard to FIG. 2A. The number and arrangement of components shown in FIG. 2A are provided as an example. In practice, the gate driver system 200A may include additional components, fewer components, different components, or differently arranged components than those shown in FIG. 2A. Two or more components shown in FIG. 2A may be implemented within a single component, or a single component shown in FIG. 2A may be implemented as multiple, distributed components. Additionally, or alternatively, a set of components (e.g., one or more components) of the gate driver system 200A may perform one or more functions described as being performed by another set of components of the gate driver system 200A.

FIG. 2B is a truth table 200B corresponding to monitoring for the first fault operating condition. "LO-COM" refers to a difference potential between LO and COM, "VS-COM" refers to a difference potential between VS and COM, and "VDES_L-COM" refers to a difference potential between VDES_L and COM. As indicated above, FIG. 2B is provided merely as an example. Other examples may differ from what is described with regard to FIG. 2B.

Figure 2C:
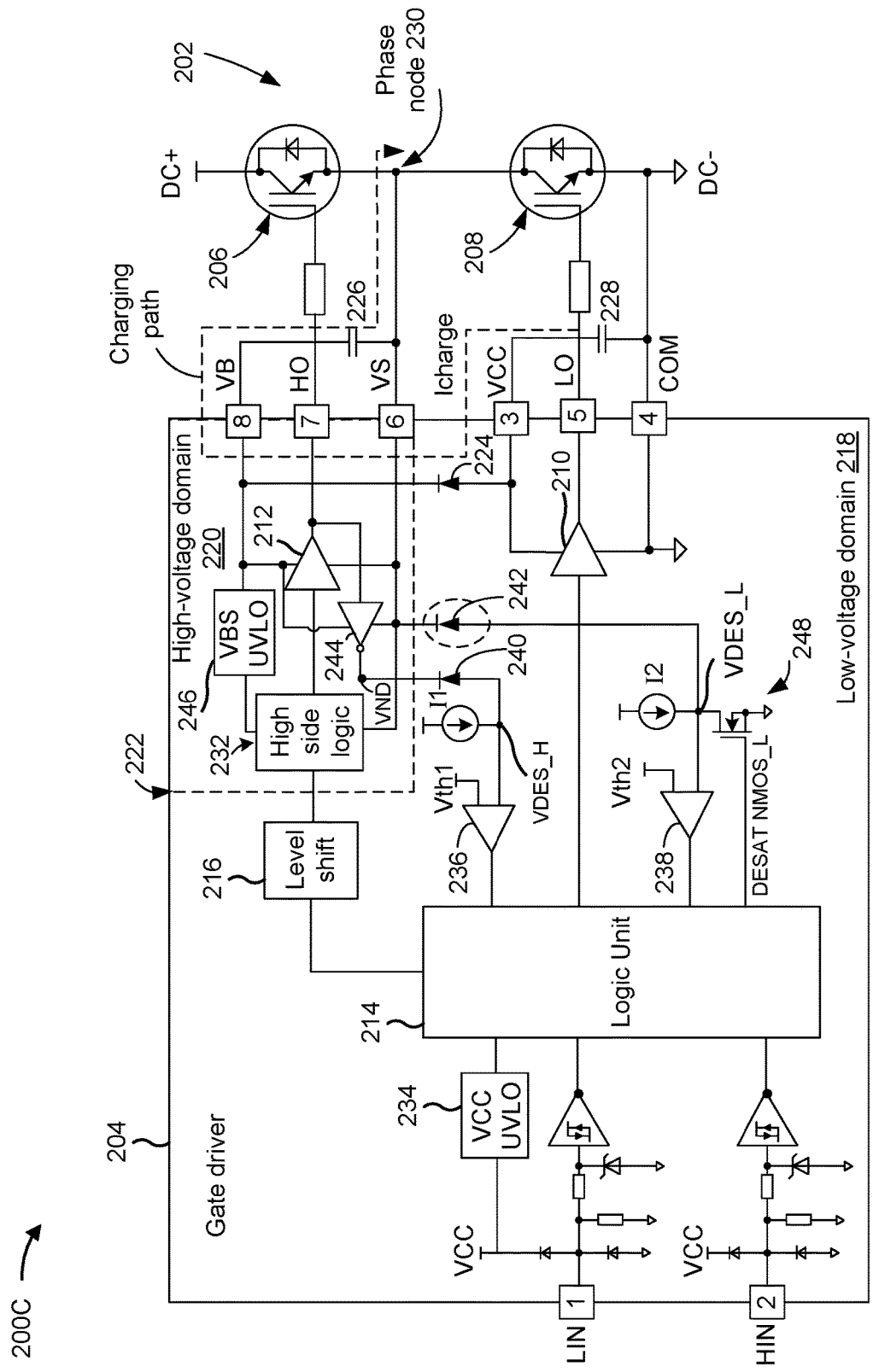
FIG. 2C illustrates a schematic block diagram of a gate driver system according to one or more implementations.

FIG. 2C illustrates a schematic block diagram of the gate driver system 200A according to one or more implementations. In particular, FIG. 2C is directed to using the half-bridge gate driver 204 to monitor for and detect a second fault operating condition. Thus, the half-bridge gate driver 204 may be configured to monitor for the first fault operating condition, as described in connection with FIGS. 2A and 2B, and/or the second fault operating condition.

For example, the half-bridge gate driver 204 may be configured to monitor for the second fault operating condition during a start-up operation or a reset operation of the half-bridge gate driver 204. Additionally, or alternatively, the half-bridge gate driver 204 may be configured to monitor for the first fault operating condition after the start-up operation or the reset operation of the half-bridge gate driver 204 has been completed. The second fault operating condition may correspond to a phase node-to-ground short that is present during the start-up operation or the reset operation of the half-bridge gate driver 204.

During the start-up operation or the reset operation of the half-bridge gate driver 204, the low-side output signal LO and the high-side output signal HO are maintained at an off-signal level to set the low-side transistor 208 and the high-side transistor 206 in an off-state. During a normal operating condition of the start-up operation or the reset operation, while the low-side output signal LO and the high-side output signal HO are maintained at the off-signal level, the phase voltage VS at the phase node terminal 6 is configured to be charged through a charging path by a charging current Icharge. For example, the phase voltage VS may be charged by the bootstrap diode 224 and the voltage charging device 226 by VCC. The phase voltage VS should be charged to a voltage level that is greater than a predefined voltage, such as an UVLO voltage set by the VCC UVLO circuit 234 or the VBS UVLO circuit 246. As a result, charging the phase voltage VS to the voltage level that is greater than the predefined voltage, the measurement value VDES_L is pulled to be greater than the threshold Vth2 of the second comparator 238 by the phase voltage VS, and the comparison result of the second comparator 238 indicates that the measurement value VDES_L satisfies the threshold Vth2, thereby indicating the normal operating condition. For example, when the measurement value VDES_L satisfies the threshold Vth2 by being greater than the threshold Vth2, there is no fault condition and the gate driver system 200A is detected as operating normally.

In contrast, during the second fault operating condition corresponding to a fault operating condition of the start-up operation or the reset operation, while the low-side output signal LO and the high-side output signal HO are maintained at the off-signal level, the measurement value VDES_L is pulled to be less than the threshold Vth by the phase voltage VS, and the comparison result of the second comparator 238 indicates that the measurement value VDES_L does not satisfy the threshold Vth2 (e.g., VDES_L is not greater than Vth2), thereby indicating that the second fault operating condition is present.

The logic unit 214 may be configured to enable monitoring for the second fault operating condition based on a charging of the fixed power supply terminal 3 to VCC. For example, during the start-up operation or the reset operation of the half-bridge gate driver 204, the fixed power supply terminal 3 may be charged to the low-side fixed supply voltage VCC provided by a power supply (e.g., by the voltage charging device 228). The VCC UVLO circuit 234 may be configured as part of a monitoring circuit to monitor a voltage level of the fixed power supply terminal 3 (e.g., to monitor the charging of VCC), and trigger a monitoring operation of the phase node terminal 6 in response to the voltage level of the fixed power supply terminal 3 satisfying a VCC UVLO voltage (e.g., in response to the voltage level of the fixed power supply terminal 3 being equal to and/or greater than the VCC UVLO voltage). Once the voltage level of the fixed power supply terminal 3 satisfies the VCC UVLO voltage, measurement value VDES_L may be considered as a reliable representation of the operating condition of the half-bridge gate driver 204. Thus, the logic unit 214 may be configured to monitor the comparison result of the second comparator 238 for the second fault operating condition in response to receiving a trigger from the VCC UVLO circuit 234 that indicates that the fixed power supply terminal 3 has satisfied the VCC UVLO voltage.

The logic unit 214 may be configured to monitor the comparison result of the second comparator 238 for a predetermined time interval during the monitoring operation. For example, the predetermined time interval may be a startup interval. The predetermined time interval may start at a trigger time at which the monitoring operation is triggered by the monitoring circuit (e.g., triggered by the VCC UVLO circuit 234). In addition, in response to the predetermined time interval lapsing without the second fault operating condition being indicated by the second comparator 238 (e.g., the startup or reset operation is complete), the logic unit 214 may determine that the second fault operating condition is not present and may be configured to start driving the high-side output signal HO and the low-side output signal LO between respective switching states. Furthermore, in response to the predetermined time interval lapsing, the logic unit 214 may be configured to start monitoring for the first fault operating condition while the low-side transistor 208 is in the on-state.

As indicated above, FIG. 2C is provided merely as an example. Other examples may differ from what is described with regard to FIG. 2C. For example, in some implementations, additional circuit components may be added without deviating from the disclosure provided above.

FIG. 2D is a truth table 200D corresponding to monitoring for the second fault operating condition. "LO-COM" refers to a difference potential between LO and COM, "VS-COM" refers to a difference potential between VS and COM, "VDES_L-COM" refers to a difference potential between VDES_L and COM, and "HO-VS" refers to a difference potential between HO and VS. As indicated above, FIG. 2D is provided merely as an example. Other examples may differ from what is described with regard to FIG. 2D.

Figure 2E:
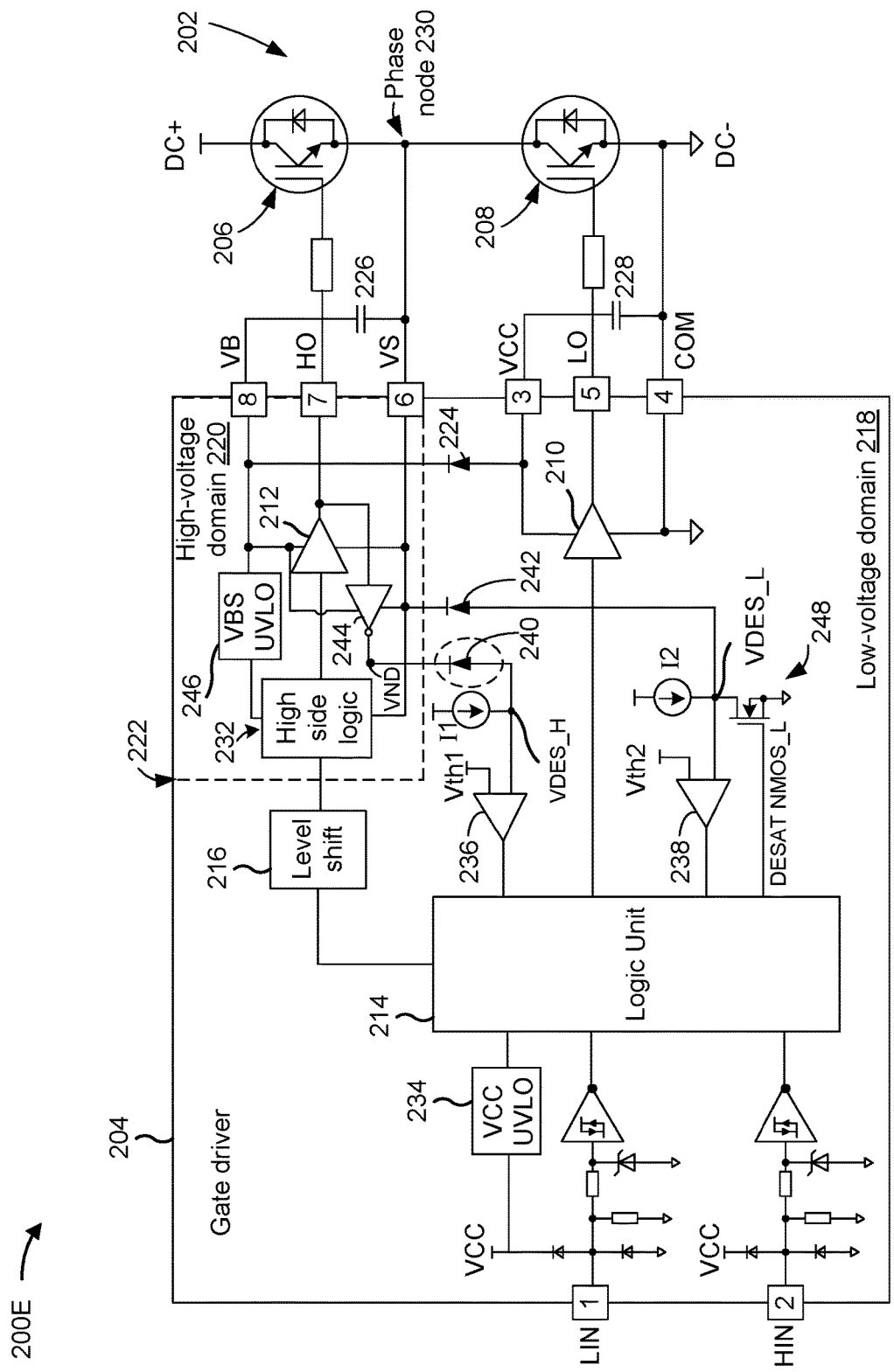
FIG. 2E illustrates a schematic block diagram of a gate driver system according to one or more implementations.

FIG. 2E illustrates a schematic block diagram of the gate driver system 200A according to one or more implementations. In particular, FIG. 2E is directed to using the half-bridge gate driver 204 to monitor for and detect a third fault operating condition, such as a high-side desaturation fault condition. Thus, the half-bridge gate driver 204 may be configured to monitor for the first fault operating condition, as described in connection with FIGS. 2A and 2B, the second fault operating condition, as described in connection with FIGS. 2C and 2D, and/or the third fault operating condition. The logic unit 214 may be configured to monitor for the third fault operating condition while the high-side transistor 206 is in an on-state. Thus, the third fault operating condition may occur when the high-side output signal HO is high (e.g., the PWM control signal HIN is high), the high-side transistor 206 is on, and the phase node 230 is shorted to DC− or COM, causing the phase voltage VS to be lower than expected. In other words, under a normal operating condition, the phase voltage VS should be pulled towards DC+ and should be close to the high-side supply potential (e.g., the phase voltage VS should differ from the high-side supply potential according to a voltage drop across the high-side transistor 206).

The logic inverter 244 includes an inverter input, an inverter output, a first supply terminal configured to receive the high-side floating supply voltage VB, and a second supply terminal configured to receive the phase voltage VS as the high-side floating reference voltage. The inverter input is coupled to the high-side output terminal 7 and is configured to receive the high-side output signal HO as an input signal. The second supply terminal is coupled to the phase node terminal 6 and is configured to receive the phase voltage VS at the phase node terminal 6 as the high-side floating reference voltage. The logic inverter 244 may be configured to generate an inverter output signal VND at the inverter output based on the input signal (e.g., high-side output signal HO), the floating supply voltage (e.g., VB), and the floating reference voltage (e.g., VS). For example, the supply voltages provided to the logic inverter 244 represent logic-high and logic-low values at the inverter output. The logic inverter 244 may measure its input and determine if the input qualifies as a logic-high input (e.g., above a threshold) or a logic-low input (e.g., below the threshold) and then outputs one of the supply voltages VB or VS that is the "logic" opposite of the input. Thus, the logic-low supply voltage (e.g., the reference supply voltage VS) would be output by the logic inverter 244 if a logic-high input has been received (e.g., if HO is at a logic-high value, such as VB). Conversely, the logic-high supply voltage (e.g., the positive supply voltage VB) would be output by the logic inverter 244 if a logic-low input has been received (e.g., if HO is at a logic-low value, such as VS). As a result, the logic inverter 244 causes the input signal to be inverted.

The voltage level of the inverter output signal VND depends on the logic-low and the logic-high supply voltages. For example, the reference ("ground") supply terminal of the logic inverter 244 is connected to the phase voltage VS. Thus, the logic-low output value of the logic inverter 244 will change based on any changes to the phase voltage VS. For example, if the high-side output signal HO is configured to set the high-side transistor 206 in an on-state, the logic inverter 244 is configured to generate the inverter output signal VND with a logic-low value proportional to the phase voltage VS. On the other hand, if the high-side output signal HO is configured to set the high-side transistor 206 in an off-state, the logic inverter 244 is configured to generate the inverter output signal VND with a logic-high value proportional to the high-side floating supply voltage VB.

When there is a short at the low-side transistor 208, the phase voltage VS is pulled down to COM when it normally should be only about 15V below VB. As a result, the logic-low output value of the logic inverter 244 (e.g., the output when the high-side transistor 206 is on) drops much lower than a normal value. The first comparator 236 is configured to detect that the inverter output signal VND has fallen below a threshold Vth1. It is this change in the logic-low output value of the logic inverter 244 that the half-bridge gate driver 204 uses to detect the third fault operating condition.

The low-side output terminal 5 and the first comparator 236 are arranged in the low-side region 218, the high-side output terminal 7 and the phase node terminal 6 are arranged in the high-side region 220, and the bit transfer diode 240 is coupled to the first circuitry of the low-side region 218 and to the second circuitry of the high-side region 220. In some implementations, the bit transfer diode 240 may be arranged in the low-side region 218. In some implementations, the bit transfer diode 240 may be arranged in the isolation region 222.

The bit transfer diode 240 may be configured to transfer a single bit from the second voltage domain to the first voltage domain of the half-bridge gate driver 204. The single bit may indicate whether or not the third fault operating condition is present during an on-state interval during which the high-side output signal HO is configured to set the high-side transistor 206 in an on-state.

The bit transfer diode 240 includes an anode and a cathode. The cathode is coupled to the inverter output for receiving the inverter output signal VND from the inverter output. The anode is coupled to a first input terminal of the first comparator 236. A measurement value VDES_H is provided at the anode of the bit transfer diode 240 based on the inverter output signal VND. For example, the measurement value VDES_H may be clamped to a voltage level of the inverter output signal VND plus the forward voltage VF of the bit transfer diode 240 (e.g., VDES_H=VND+VF). Thus, the measurement value VDES_H may be representative of the voltage level of the inverter output signal VND. The first comparator 236 includes a second input terminal coupled to a threshold source for receiving a threshold Vth1. The threshold Vth1 may be generated internally by the half-bridge gate driver 204, for example, by the logic unit 214 based on VCC and a programmable voltage divider.

The first comparator 236 further includes an output terminal coupled to the logic unit 214. The first comparator 236 may be configured to compare the values at its two input terminals (e.g., the measurement value VDES_H with the threshold Vth1) and output a comparison result indicating whether the measurement value VDES_H satisfies the threshold Vth1. In other words, the comparison result of the first comparator 236 may indicate whether or not the third fault operating condition is present. In some implementations, the measurement value VDES_H may satisfy the threshold Vth1 when the measurement value VDES_H is greater than the threshold Vth1. The comparison result of the first comparator 236 may indicate that the half-bridge gate driver 204 is operating normally when the measurement value VDES_H satisfies the threshold Vth1 (e.g., the measurement value VDES_H is greater than the threshold Vth1) and may indicate that the third fault operating condition is present when the measurement value VDES_H does not satisfy the threshold Vth1 (e.g., the measurement value VDES_H is not greater than the threshold Vth1). The logic unit 214 may refer to the PWM control signal HIN to determine when the high-side transistor 206 is on, and may monitor the comparison result of the first comparator 236 when the high-side transistor 206 is on.

Under a normal operating condition corresponding to a no-fault condition, if the high-side output signal Ho is configured to set the high-side transistor 206 in an on-state and the low-side output signal LO is configured to set the low-side transistor 208 in an off-state: the phase voltage VS at the phase node terminal 6 is configured to be pulled toward the high-side supply potential provided by the DC-link positive supply DC+, the logic inverter 244 is configured to generate the inverter output signal VND with a logic-low value representative of the phase voltage VS, the measurement value VDES_H is pulled to be greater than the threshold Vth1 by the inverter output signal VND, and the comparison result of the first comparator 236 indicates that the measurement value VDES_H satisfies the threshold, thereby indicating the normal operating condition.

Under the third fault operating condition, if the high-side output signal HO is configured to set the high-side transistor 206 in an on-state and the low-side output signal LO is configured to set the low-side transistor 208 in an off-state: the phase voltage VS at the phase node terminal 6 is configured to be pulled toward the low-side supply potential provided by the DC-link negative supply DC− or COM, the logic inverter 244 is configured to generate the inverter output signal VND with a logic-low value representative of the phase voltage VS, the measurement value VDES_H is pulled to be less than the threshold Vth1 by the inverter output signal VND, and the comparison result of the first comparator 236 indicates that the measurement value VDES_H does not satisfy the threshold Vth1, thereby indicating the third fault operating condition. Thus, under the third fault operating condition, if the high-side output signal HO is configured to set the high-side transistor 206 in the on-state and the low-side output signal LO is configured to set the low-side transistor 208 in the off-state: the measurement value VDES_H may be clamped to a difference between the forward voltage VF of the bit transfer diode 240 and a voltage drop across the low-side transistor 208, and the difference is less than the threshold Vth1.

As indicated above, FIG. 2E is provided merely as an example. Other examples may differ from what is described with regard to FIG. 2E. For example, in some implementations, additional circuit components may be added without deviating from the disclosure provided above.

FIG. 2F is a truth table 200F corresponding to monitoring for the third fault operating condition. "HO-VS" refers to a difference potential between HO and VS, "VS-COM" refers to a difference potential between VS and COM, "VND-COM" refers to a difference potential between VND and COM, and "VDES_H-COM" refers to a difference potential between VDES_H and COM. In the truth table 200F, the symbol "~" means "approximate to." As indicated above, FIG. 2F is provided merely as an example. Other examples may differ from what is described with regard to FIG. 2F.

The following provides an overview of some Aspects of the present disclosure:

Aspect 1: A monolithic half-bridge gate driver, comprising: a low-side output terminal configured to be coupled to a control terminal of a low-side transistor of a half-bridge and configured to output a low-side output signal in order to drive the low-side transistor between switching states; a high-side output terminal configured to be coupled to a control terminal of a high-side transistor of the half-bridge and configured to output a high-side output signal in order to drive the high-side transistor between switching states; a phase node terminal configured to be coupled to a phase node to which the high-side transistor and the low-side transistor are coupled, wherein the phase node terminal is configured to be connected to a high-side supply potential by the high-side transistor if the high-side transistor is turned on, and wherein the phase node terminal is configured to be connected to a low-side supply potential by the low-side transistor if the low-side transistor is turned on; a diode comprising an anode and a cathode, wherein the cathode is coupled to the phase node terminal; and a comparator comprising a first input terminal coupled to the anode of the diode for receiving a measurement value indicative of a phase voltage at the phase node terminal, a second input terminal coupled to a threshold source for receiving a threshold, and an output terminal configured to output a comparison result indicating whether the measurement value satisfies the threshold.

Aspect 2: The monolithic half-bridge gate driver of Aspect 1, wherein, under a normal operating condition corresponding to a no-fault condition, if the low-side output signal is configured to set the low-side transistor in an on-state and the high-side output signal is configured to set the high-side transistor in an off-state: the phase voltage at the phase node terminal is configured to be pulled toward the low-side supply potential, the measurement value is pulled to be less than the threshold by the phase voltage, and the comparison result indicates that the measurement value does not satisfy the threshold, thereby indicating the normal operating condition.

Aspect 3: The monolithic half-bridge gate driver of Aspect 2, wherein, under the normal operating condition, if the low-side output signal is configured to set the low-side transistor in the on-state and the high-side output signal is configured to set the high-side transistor in the off-state: the measurement value is clamped to a difference between a forward voltage of the diode and a voltage drop across the low-side transistor, wherein the difference is less than the threshold.

Aspect 4: The monolithic half-bridge gate driver of any of Aspects 1-3, wherein, under a fault operating condition, if the low-side output signal is configured to set the low-side transistor in an on-state and the high-side output signal is configured to set the high-side transistor in an off-state: the phase voltage at the phase node terminal is configured to be pulled toward the high-side supply potential, the measurement value is pulled to be greater than the threshold by the phase voltage, and the comparison result indicates that the measurement value satisfies the threshold, thereby indicating the fault operating condition.

Aspect 5: The monolithic half-bridge gate driver of any of Aspects 1-4, further comprising: a low-side region comprising first circuitry that operates in a first voltage domain; a high-side region comprising second circuitry that operates in a second voltage domain; and an isolation region that electrically isolates the low-side region and the high-side region, wherein the low-side output terminal and the comparator are arranged in the low-side region, wherein the high-side output terminal and the phase node terminal are arranged in the high-side region, and wherein the diode is coupled to the first circuitry and the second circuitry.

Aspect 6: The monolithic half-bridge gate driver of Aspect 5, wherein the first circuitry includes a low-side gate driver coupled to the low-side output terminal, the low-side gate driver being configured to generate the low-side output signal and provide the low-side output signal to the low-side output terminal, and wherein the second circuitry includes a high-side gate driver coupled to the high-side output terminal, the high-side gate driver being configured to generate the high-side output signal and provide the high-side output signal to the high-side output terminal.

Aspect 7: The monolithic half-bridge gate driver of any of Aspects 1-6, wherein, during a start-up operation or a reset operation of the monolithic half-bridge gate driver, the low-side output signal and the high-side output signal are maintained at an off-signal level to set the low-side transistor and the high-side transistor in an off-state, wherein during a normal operating condition of the start-up operation or the reset operation, while the low-side output signal and the high-side output signal are maintained at the off-signal level: the phase voltage at the phase node terminal is configured to be charged to a voltage level greater than a predefined voltage, the measurement value is pulled to be greater than the threshold by the phase voltage, and the comparison result indicates that the measurement value satisfies the threshold, thereby indicating the normal operating condition.

Aspect 8: The monolithic half-bridge gate driver of Aspect 7, wherein the predefined voltage is an undervoltage-lockout (UVLO) voltage.

Aspect 9: The monolithic half-bridge gate driver of any of Aspects 1-8, wherein, during a start-up operation or a reset operation of the monolithic half-bridge gate driver, the low-side output signal and the high-side output signal are maintained at an off-signal level to set the low-side transistor and the high-side transistor in an off-state, wherein during a fault operating condition of the start-up operation or the reset operation, while the low-side output signal and the high-side output signal are maintained at the off-signal level: the measurement value is pulled to be less than the threshold by the phase voltage, and the comparison result indicates that the measurement value does not satisfy the threshold, thereby indicating the fault operating condition.

Aspect 10: The monolithic half-bridge gate driver of Aspect 9, further comprising: a power supply terminal configured to be coupled to a power supply, wherein the power supply terminal is configured to be charged to a power supply potential provided by the power supply during the start-up operation or the reset operation of the monolithic half-bridge gate driver, a monitoring circuit configured to monitor a voltage level of the power supply terminal, and trigger a monitoring operation of the phase node terminal in response to the voltage level of the power supply terminal satisfying an undervoltage-lockout (UVLO) voltage, wherein the monitoring circuit is configured to monitor the comparison result in response to the monitoring operation being triggered.

Aspect 11: The monolithic half-bridge gate driver of Aspect 10, wherein the monitoring circuit is configured to monitor the comparison result for a predetermined time interval during the monitoring operation, wherein the predetermined time interval starts at a trigger time at which the monitoring operation is triggered by the monitoring circuit.

Aspect 12: The monolithic half-bridge gate driver of Aspect 11, wherein, in response to the predetermined time interval lapsing without the fault operating condition being indicated, the monolithic half-bridge gate driver is configured to drive the high-side output signal and the low-side output signal between respective switching states.

Aspect 13: A monolithic half-bridge gate driver, comprising: a low-side output terminal configured to be coupled to a control terminal of a low-side transistor of a half-bridge and configured to output a low-side output signal in order to drive the low-side transistor between respective switching states; a high-side output terminal configured to be coupled to a control terminal of a high-side transistor of the half-bridge and configured to output a high-side output signal in order to drive the high-side transistor between respective switching states; a phase node terminal configured to be coupled to a phase node to which the high-side transistor and the low-side transistor are coupled, wherein the phase node terminal is configured to be connected to a high-side supply potential by the high-side transistor if the high-side transistor is turned on, and wherein the phase node terminal is configured to be connected to a low-side supply potential by the low-side transistor if the low-side transistor is turned on; an inverter comprising an inverter input, an inverter output, a first supply terminal configured to receive a floating supply voltage, and a second supply terminal configured to receive a floating reference voltage, wherein the inverter input is coupled to the high-side output terminal and configured to receive the high-side output signal as an input signal, wherein the second supply terminal is coupled to the phase node terminal and is configured to receive a phase voltage at the phase node terminal as the floating reference voltage, wherein the inverter is configured to generate an inverter output signal at the inverter output based on the input signal, the floating supply voltage, and the floating reference voltage; a diode comprising an anode and a cathode, wherein the cathode is coupled to the inverter output for receiving the inverter output signal from the inverter output; and a comparator comprising a first input terminal coupled to the anode of the diode for receiving a measurement value representative of the inverter output signal, a second input terminal coupled to a threshold source for receiving a threshold, and an output terminal configured to output a comparison result indicating whether the measurement value satisfies the threshold.

Aspect 14: The monolithic half-bridge gate driver of Aspect 13, wherein, under a normal operating condition corresponding to a no-fault condition, if the high-side output signal is configured to set the high-side transistor in an on-state and the low-side output signal is configured to set the low-side transistor in an off-state: the phase voltage at the phase node terminal is configured to be pulled toward the high-side supply potential, the inverter is configured to generate the inverter output signal with a logic-low value representative of the phase voltage, the measurement value is pulled to be greater than the threshold by the inverter output signal, and the comparison result indicates that the measurement value satisfies the threshold, thereby indicating the normal operating condition.

Aspect 15: The monolithic half-bridge gate driver of any of Aspects 13-14, wherein, under a fault operating condition, if the high-side output signal is configured to set the high-side transistor in an on-state and the low-side output signal is configured to set the low-side transistor in an off-state: the phase voltage at the phase node terminal is configured to be pulled toward the low-side supply potential, the inverter is configured to generate the inverter output signal with a logic-low value representative of the phase voltage, the measurement value is pulled to be less than the threshold by the inverter output signal, and the comparison result indicates that the measurement value does not satisfy the threshold, thereby indicating the fault operating condition.

Aspect 16: The monolithic half-bridge gate driver of Aspect 15, wherein, under the fault operating condition, if the high-side output signal is configured to set the high-side transistor in the on-state and the low-side output signal is configured to set the low-side transistor in the off-state: the measurement value is clamped to a difference between a forward voltage of the diode and a voltage drop across the low-side transistor, wherein the difference is less than the threshold.

Aspect 17: The monolithic half-bridge gate driver of any of Aspects 13-16, wherein, if the high-side output signal is configured to set the high-side transistor in an on-state, the inverter is configured to generate the inverter output signal with a logic-low value proportional to the phase voltage, and wherein, if the high-side output signal is configured to set the high-side transistor in an off-state, the inverter is configured to generate the inverter output signal with a logic-high value proportional to the floating supply voltage.

Aspect 18: The monolithic half-bridge gate driver of any of Aspects 13-17, further comprising: a low-side region comprising first circuitry that operates in a first voltage domain; a high-side region comprising second circuitry that operates in a second voltage domain; and an isolation region that electrically isolates the low-side region and the high-side region, wherein the low-side output terminal and the comparator are arranged in the low-side region, wherein the high-side output terminal and the phase node terminal are arranged in the high-side region, and wherein the diode is coupled to the first circuitry and the second circuitry.

Aspect 19: The monolithic half-bridge gate driver of Aspect 18, wherein the diode is a bit transfer diode configured to transfer a single bit from the second voltage domain to the first voltage domain, wherein the single bit indicates whether or not a fault operating condition is present during an on-state interval during which the high-side output signal is configured to set the high-side transistor in an on-state.

Aspect 20: The monolithic half-bridge gate driver of Aspect 18, wherein the first circuitry includes a low-side gate driver coupled to the low-side output terminal, the low-side gate driver being configured to generate the low-side output signal and provide the low-side output signal to the low-side output terminal, and wherein the second circuitry includes a high-side gate driver coupled to the high-side output terminal, the high-side gate driver being configured to generate the high-side output signal and provide the high-side output signal to the high-side output terminal.

Aspect 21: A method for detecting a fault operating condition, comprising: generating a low-side output signal in order to drive a low-side transistor of a half-bridge between respective switching states; generating a high-side output signal in order to drive a high-side transistor of the half-bridge between respective switching states, wherein the high-side transistor and the low-side transistor are coupled to a phase node terminal, wherein the phase node terminal is connected to a high-side supply potential by the high-side transistor if the high-side transistor is turned on, and the phase node terminal is connected to a low-side supply potential by the low-side transistor if the low-side transistor is turned on; providing the high-side output signal as an input signal to an inverter; providing a floating supply voltage to a first supply terminal of the inverter; providing a phase voltage generated at the phase node terminal as a floating reference voltage to a second supply terminal of the inverter; generating an inverter output signal by the inverter based on the input signal, the floating supply voltage, and the floating reference voltage; providing the inverter output signal to a cathode of a diode; and comparing a measurement value at an anode of the diode with a threshold to generate a comparison result that indicates whether the measurement value satisfies the threshold, wherein the measurement value is representative of the inverter output signal of the inverter, and wherein the comparison result indicates whether or not the fault operating condition is present during an on-state interval during which the high-side output signal sets the high-side transistor in an on-state.

Aspect 22: A method for detecting a fault operating condition, comprising: generating a low-side output signal in order to drive a low-side transistor of a half-bridge between respective switching states; generating a high-side output signal in order to drive a high-side transistor of a half-bridge between respective switching states, wherein the high-side transistor and the low-side transistor are coupled to a phase node terminal, wherein the phase node terminal is connected to a high-side supply potential by the high-side transistor if the high-side transistor is turned on, and the phase node terminal is connected to a low-side supply potential by the low-side transistor if the low-side transistor is turned on, wherein a voltage at the phase node terminal is a phase voltage; providing the phase voltage to a cathode of a diode; and comparing a measurement value at an anode of the diode with a threshold to generate a comparison result that indicates whether the measurement value satisfies the threshold, wherein the measurement value is representative of the phase voltage, and wherein the comparison result indicates whether or not the fault operating condition is present.

Aspect 23: A monolithic half-bridge gate driver, comprising: a low-side output terminal configured to be coupled to a control terminal of a low-side transistor of a half-bridge and configured to output a low-side output signal in order to drive the low-side transistor between respective switching states; a high-side output terminal configured to be coupled to a control terminal of a high-side transistor of the half-bridge and configured to output a high-side output signal in order to drive the high-side transistor between respective switching states; a phase node terminal configured to be coupled to a phase node to which the high-side transistor and the low-side transistor are coupled, wherein the phase node terminal is configured to be connected to a high-side supply potential by the high-side transistor if the high-side transistor is turned on, and wherein the phase node terminal is configured to be connected to a low-side supply potential by the low-side transistor if the low-side transistor is turned on; an inverter comprising an inverter input, an inverter output, a first supply terminal configured to receive a floating supply voltage, and a second supply terminal configured to receive a floating reference voltage, wherein the inverter input is coupled to the high-side output terminal and configured to receive the high-side output signal as an input signal, wherein the second supply terminal is coupled to the phase node terminal and is configured to receive a phase voltage at the phase node terminal as the floating reference voltage, wherein the inverter is configured to generate an inverter output signal at the inverter output based on the input signal, the floating supply voltage, and the floating reference voltage; a first diode comprising a first anode and a first cathode, wherein the first cathode is coupled to the inverter output for receiving the inverter output signal from the inverter output; a first comparator comprising a first input terminal coupled to the first anode of the first diode for receiving a first measurement value representative of the inverter output signal, a second input terminal coupled to a first threshold source for receiving a first threshold, and a first output terminal configured to output a first comparison result indicating whether the first measurement value satisfies the first threshold; a second diode comprising a second anode and a second cathode, wherein the second cathode is coupled to the phase node terminal; and a second comparator comprising a third input terminal coupled to the second anode of the second diode for receiving a second measurement value indicative of a phase voltage at the phase node terminal, a fourth input terminal coupled to a second threshold source for receiving a second threshold, and a second output terminal configured to output a second comparison result indicating whether the second measurement value satisfies the second threshold.

Aspect 24: A method for detecting a plurality of fault operating conditions, comprising: generating a low-side output signal in order to drive a low-side transistor of a half-bridge between respective switching states; generating a high-side output signal in order to drive a high-side transistor of the half-bridge between respective switching states, wherein the high-side transistor and the low-side transistor are coupled to a phase node terminal, wherein the phase node terminal is connected to a high-side supply potential by the high-side transistor if the high-side transistor is turned on, and the phase node terminal is connected to a low-side supply potential by the low-side transistor if the low-side transistor is turned on; providing the high-side output signal as an input signal to an inverter; providing a floating supply voltage to a first supply terminal of the inverter; providing a phase voltage generated at the phase node terminal as a floating reference voltage to a second supply terminal of the inverter; generating an inverter output signal by the inverter based on the input signal, the floating supply voltage, and the floating reference voltage; providing the inverter output signal to a first cathode of a first diode; comparing a first measurement value at a first anode of the first diode with a first threshold to generate a first comparison result that indicates whether the first measurement value satisfies the first threshold, wherein the first measurement value is representative of the inverter output signal of the inverter, and wherein the first comparison result indicates whether or not a first fault operating condition is present during an on-state interval during which the high-side output signal sets the high-side transistor in an on-state; providing the phase voltage to a second cathode of a second diode; and comparing a second measurement value at a second anode of the second diode with a second threshold to generate a second comparison result that indicates whether the second measurement value satisfies the second threshold, wherein the second measurement value is representative of the phase voltage, and wherein the second comparison result indicates whether or not a second fault operating condition is present.

Aspect 25: A system configured to perform one or more operations recited in one or more of Aspects 1-24.

Aspect 26: An apparatus comprising means for performing one or more operations recited in one or more of Aspects 1-24.

Aspect 27: A non-transitory computer-readable medium storing a set of instructions, the set of instructions comprising one or more instructions that, when executed by a device, cause the device to perform one or more operations recited in one or more of Aspects 1-24.

Aspect 28: A computer program product comprising instructions or code for executing one or more operations recited in one or more of Aspects 1-24.

The foregoing disclosure provides illustration and description, but is not intended to be exhaustive or to limit the implementations to the precise form disclosed. Modifications and variations may be made in light of the above disclosure or may be acquired from practice of the implementations.

Some implementations may be described herein in connection with thresholds. As used herein, "satisfying" a threshold may refer to a value being greater than the threshold, more than the threshold, higher than the threshold, greater than or equal to the threshold, less than the threshold, fewer than the threshold, lower than the threshold, less than or equal to the threshold, equal to the threshold, or the like.

As used herein, the term "component" is intended to be broadly construed as hardware, firmware, or a combination of hardware and software. Systems and/or methods described herein may be implemented in different forms of hardware, firmware, or a combination of hardware and software. The actual specialized control hardware or software code used to implement these systems and/or methods is not limiting of the implementations. Thus, the operation and behavior of the systems and/or methods are described herein without reference to specific software code—it being understood that software and hardware can be designed to implement the systems and/or methods based on the description herein.

Any of the processing components may be implemented as a central processing unit (CPU) or other processor reading and executing a software program from a non-transitory computer-readable recording medium such as a hard disk or a semiconductor memory device. For example, instructions may be executed by one or more processors, such as one or more CPUs, digital signal processors (DSPs), general-purpose microprocessors, application-specific integrated circuits (ASICs), field programmable logic arrays (FPLAs), programmable logic controller (PLC), or other equivalent integrated or discrete logic circuitry. Accordingly, the term "processor," as used herein, refers to any of the foregoing structures or any other structure suitable for implementation of the techniques described herein. Software may be stored on a non-transitory computer-readable medium such that the non-transitory computer readable medium includes program code or a program algorithm stored thereon that, when executed, causes the processor, via a computer program, to perform the steps of a method.

A controller including hardware may also perform one or more of the techniques of this disclosure. A controller, including one or more processors, may use electrical signals and digital algorithms to perform its receptive, analytic, and control functions, which may further include corrective functions. Such hardware, software, and firmware may be implemented within the same device or within separate devices to support the various techniques described in this disclosure.

A signal processing circuit and/or a signal conditioning circuit may receive one or more signals (e.g., measurement signals) from one or more components in the form of raw measurement data and may derive, from the measurement signal, further information. "Signal conditioning," as used herein, refers to manipulating an analog signal in such a way that the signal meets the requirements of a next stage for further processing. Signal conditioning may include converting from analog to digital (e.g., via an analog-to-digital converter), amplification, filtering, converting, biasing, range matching, isolation, and any other processes required to make a signal suitable for processing after conditioning.

Even though particular combinations of features are recited in the claims and/or disclosed in the specification, these combinations are not intended to limit the disclosure of implementations described herein. Many of these features may be combined in ways not specifically recited in the claims and/or disclosed in the specification. For example, the disclosure includes each dependent claim in a claim set in combination with every other individual claim in that claim set and every combination of multiple claims in that claim set. As used herein, a phrase referring to "at least one of" a list of items refers to any combination of those items, including single members. As an example, "at least one of: a, b, or c" is intended to cover a, b, c, a and b, a and c, b and c, and a, b, and c, as well as any combination with multiples of the same element (e.g., a+a, a+a+a, a+a+b, a+a+c, a+b+b, a+c+c, b+b, b+b+b, b+b+c, c+c, and c+c+c, or any other ordering of a, b, and c).

Further, it is to be understood that the disclosure of multiple acts or functions disclosed in the specification or in the claims may not be construed as to be within the specific order. Therefore, the disclosure of multiple acts or functions will not limit these to a particular order unless such acts or functions are not interchangeable for technical reasons. Furthermore, in some implementations, a single act may include or may be broken into multiple sub acts. Such sub acts may be included and part of the disclosure of this single act unless explicitly excluded.

No element, act, or instruction used herein should be construed as critical or essential unless explicitly described as such. Also, as used herein, the articles "a" and "an" are intended to include one or more items and may be used interchangeably with "one or more." Further, as used herein, the article "the" is intended to include one or more items referenced in connection with the article "the" and may be used interchangeably with "the one or more." Where only one item is intended, the phrase "only one," "single," or similar language is used. Also, as used herein, the terms "has," "have," "having," or the like are intended to be open-ended terms that do not limit an element that they modify (e.g., an element "having" A may also have B). Further, the phrase "based on" is intended to mean "based, at least in part, on" unless explicitly stated otherwise. As used herein, the term "multiple" can be replaced with "a plurality of" and vice versa. Also, as used herein, the term "or" is intended to be inclusive when used in a series and may be used interchangeably with "and/or," unless explicitly stated otherwise (e.g., if used in combination with "either" or "only one of").

What is claimed is:

1. A monolithic half-bridge gate driver, comprising:
   a low-side output terminal configured to be coupled to a control terminal of a low-side transistor of a half-bridge and configured to output a low-side output signal in order to drive the low-side transistor between switching states;
   a high-side output terminal configured to be coupled to a control terminal of a high-side transistor of the half-bridge and configured to output a high-side output signal in order to drive the high-side transistor between switching states;
   a phase node terminal configured to be coupled to a phase node to which the high-side transistor and the low-side transistor are coupled, wherein the phase node terminal is configured to be connected to a high-side supply potential by the high-side transistor if the high-side transistor is turned on, and wherein the phase node terminal is configured to be connected to a low-side supply potential by the low-side transistor if the low-side transistor is turned on;
   a diode comprising an anode and a cathode, wherein the cathode is coupled to the phase node terminal; and
   a comparator comprising a first input terminal coupled to the anode of the diode for receiving a measurement value indicative of a phase voltage at the phase node terminal, a second input terminal coupled to a threshold source for receiving a threshold, and an output terminal configured to output a comparison result indicating whether the measurement value satisfies the threshold.

2. The monolithic half-bridge gate driver of claim 1, wherein, under a normal operating condition corresponding to a no-fault condition, if the low-side output signal is configured to set the low-side transistor in an on-state and the high-side output signal is configured to set the high-side transistor in an off-state:
   the phase voltage at the phase node terminal is configured to be pulled toward the low-side supply potential,
   the measurement value is pulled to be less than the threshold by the phase voltage, and
   the comparison result indicates that the measurement value does not satisfy the threshold, thereby indicating the normal operating condition.

3. The monolithic half-bridge gate driver of claim 2, wherein, under the normal operating condition, if the low-side output signal is configured to set the low-side transistor in the on-state and the high-side output signal is configured to set the high-side transistor in the off-state:
   the measurement value is clamped to a difference between a forward voltage of the diode and a voltage drop across the low-side transistor, wherein the difference is less than the threshold.

4. The monolithic half-bridge gate driver of claim 1, wherein, under a fault operating condition, if the low-side output signal is configured to set the low-side transistor in an on-state and the high-side output signal is configured to set the high-side transistor in an off-state:
   the phase voltage at the phase node terminal is configured to be pulled toward the high-side supply potential,
   the measurement value is pulled to be greater than the threshold by the phase voltage, and
   the comparison result indicates that the measurement value satisfies the threshold, thereby indicating the fault operating condition.

5. The monolithic half-bridge gate driver of claim 1, further comprising:
   a low-side region comprising first circuitry that operates in a first voltage domain;
   a high-side region comprising second circuitry that operates in a second voltage domain; and
   an isolation region that electrically isolates the low-side region and the high-side region,
      wherein the low-side output terminal and the comparator are arranged in the low-side region,
      wherein the high-side output terminal and the phase node terminal are arranged in the high-side region, and
      wherein the diode is coupled to the first circuitry and the second circuitry.

6. The monolithic half-bridge gate driver of claim 5, wherein the first circuitry includes a low-side gate driver coupled to the low-side output terminal, the low-side gate driver being configured to generate the low-side output signal and provide the low-side output signal to the low-side output terminal, and
   wherein the second circuitry includes a high-side gate driver coupled to the high-side output terminal, the high-side gate driver being configured to generate the high-side output signal and provide the high-side output signal to the high-side output terminal.

7. The monolithic half-bridge gate driver of claim 1, wherein, during a start-up operation or a reset operation of the monolithic half-bridge gate driver, the low-side output signal and the high-side output signal are maintained at an off-signal level to set the low-side transistor and the high-side transistor in an off-state,
  wherein during a normal operating condition of the start-up operation or the reset operation, while the low-side output signal and the high-side output signal are maintained at the off-signal level:
    the phase voltage at the phase node terminal is configured to be charged to a voltage level greater than a predefined voltage,
    the measurement value is pulled to be greater than the threshold by the phase voltage, and
    the comparison result indicates that the measurement value satisfies the threshold, thereby indicating the normal operating condition.

8. The monolithic half-bridge gate driver of claim 7, wherein the predefined voltage is an undervoltage-lockout (UVLO) voltage.

9. The monolithic half-bridge gate driver of claim 1, wherein, during a start-up operation or a reset operation of the monolithic half-bridge gate driver, the low-side output signal and the high-side output signal are maintained at an off-signal level to set the low-side transistor and the high-side transistor in an off-state,
  wherein during a fault operating condition of the start-up operation or the reset operation, while the low-side output signal and the high-side output signal are maintained at the off-signal level:
    the measurement value is pulled to be less than the threshold by the phase voltage, and
    the comparison result indicates that the measurement value does not satisfy the threshold, thereby indicating the fault operating condition.

10. The monolithic half-bridge gate driver of claim 9, further comprising:
  a power supply terminal configured to be coupled to a power supply, wherein the power supply terminal is configured to be charged to a power supply potential provided by the power supply during the start-up operation or the reset operation of the monolithic half-bridge gate driver,
  a monitoring circuit configured to monitor a voltage level of the power supply terminal, and trigger a monitoring operation of the phase node terminal in response to the voltage level of the power supply terminal satisfying an undervoltage-lockout (UVLO) voltage,
  wherein the monitoring circuit is configured to monitor the comparison result in response to the monitoring operation being triggered.

11. The monolithic half-bridge gate driver of claim 10, wherein the monitoring circuit is configured to monitor the comparison result for a predetermined time interval during the monitoring operation, wherein the predetermined time interval starts at a trigger time at which the monitoring operation is triggered by the monitoring circuit.

12. The monolithic half-bridge gate driver of claim 11, wherein, in response to the predetermined time interval lapsing without the fault operating condition being indicated, the monolithic half-bridge gate driver is configured to drive the high-side output signal and the low-side output signal between respective switching states.

13. A monolithic half-bridge gate driver, comprising:
  a low-side output terminal configured to be coupled to a control terminal of a low-side transistor of a half-bridge and configured to output a low-side output signal in order to drive the low-side transistor between respective switching states;
  a high-side output terminal configured to be coupled to a control terminal of a high-side transistor of the half-bridge and configured to output a high-side output signal in order to drive the high-side transistor between respective switching states;
  a phase node terminal configured to be coupled to a phase node to which the high-side transistor and the low-side transistor are coupled, wherein the phase node terminal is configured to be connected to a high-side supply potential by the high-side transistor if the high-side transistor is turned on, and wherein the phase node terminal is configured to be connected to a low-side supply potential by the low-side transistor if the low-side transistor is turned on;
  an inverter comprising an inverter input, an inverter output, a first supply terminal configured to receive a floating supply voltage, and a second supply terminal configured to receive a floating reference voltage,
    wherein the inverter input is coupled to the high-side output terminal and configured to receive the high-side output signal as an input signal,
    wherein the second supply terminal is coupled to the phase node terminal and is configured to receive a phase voltage at the phase node terminal as the floating reference voltage,
    wherein the inverter is configured to generate an inverter output signal at the inverter output based on the input signal, the floating supply voltage, and the floating reference voltage;
  a diode comprising an anode and a cathode, wherein the cathode is coupled to the inverter output for receiving the inverter output signal from the inverter output; and
  a comparator comprising a first input terminal coupled to the anode of the diode for receiving a measurement value representative of the inverter output signal, a second input terminal coupled to a threshold source for receiving a threshold, and an output terminal configured to output a comparison result indicating whether the measurement value satisfies the threshold.

14. The monolithic half-bridge gate driver of claim 13, wherein, under a normal operating condition corresponding to a no-fault condition, if the high-side output signal is configured to set the high-side transistor in an on-state and the low-side output signal is configured to set the low-side transistor in an off-state:
  the phase voltage at the phase node terminal is configured to be pulled toward the high-side supply potential,
  the inverter is configured to generate the inverter output signal with a logic-low value representative of the phase voltage,
  the measurement value is pulled to be greater than the threshold by the inverter output signal, and
  the comparison result indicates that the measurement value satisfies the threshold, thereby indicating the normal operating condition.

15. The monolithic half-bridge gate driver of claim 13, wherein, under a fault operating condition, if the high-side output signal is configured to set the high-side transistor in an on-state and the low-side output signal is configured to set the low-side transistor in an off-state:
  the phase voltage at the phase node terminal is configured to be pulled toward the low-side supply potential,
  the inverter is configured to generate the inverter output signal with a logic-low value representative of the phase voltage,
  the measurement value is pulled to be less than the threshold by the inverter output signal, and the comparison result indicates that the measurement value does not satisfy the threshold, thereby indicating the fault operating condition.

16. The monolithic half-bridge gate driver of claim 15, wherein, under the fault operating condition, if the high-side output signal is configured to set the high-side transistor in the on-state and the low-side output signal is configured to set the low-side transistor in the off-state:
the measurement value is clamped to a difference between a forward voltage of the diode and a voltage drop across the low-side transistor, wherein the difference is less than the threshold.

17. The monolithic half-bridge gate driver of claim 13, wherein, if the high-side output signal is configured to set the high-side transistor in an on-state, the inverter is configured to generate the inverter output signal with a logic-low value proportional to the phase voltage, and
wherein, if the high-side output signal is configured to set the high-side transistor in an off-state, the inverter is configured to generate the inverter output signal with a logic-high value proportional to the floating supply voltage.

18. The monolithic half-bridge gate driver of claim 13, further comprising:
a low-side region comprising first circuitry that operates in a first voltage domain;
a high-side region comprising second circuitry that operates in a second voltage domain; and
an isolation region that electrically isolates the low-side region and the high-side region,
wherein the low-side output terminal and the comparator are arranged in the low-side region,
wherein the high-side output terminal and the phase node terminal are arranged in the high-side region, and
wherein the diode is coupled to the first circuitry and the second circuitry.

19. The monolithic half-bridge gate driver of claim 18, wherein the diode is a bit transfer diode configured to transfer a single bit from the second voltage domain to the first voltage domain,
wherein the single bit indicates whether or not a fault operating condition is present during an on-state interval during which the high-side output signal is configured to set the high-side transistor in an on-state.

20. The monolithic half-bridge gate driver of claim 18, wherein the first circuitry includes a low-side gate driver coupled to the low-side output terminal, the low-side gate driver being configured to generate the low-side output signal and provide the low-side output signal to the low-side output terminal, and
wherein the second circuitry includes a high-side gate driver coupled to the high-side output terminal, the high-side gate driver being configured to generate the high-side output signal and provide the high-side output signal to the high-side output terminal.

21. A method for detecting a fault operating condition, comprising:
generating a low-side output signal in order to drive a low-side transistor of a half-bridge between respective switching states;
generating a high-side output signal in order to drive a high-side transistor of the half-bridge between respective switching states, wherein the high-side transistor and the low-side transistor are coupled to a phase node terminal,
wherein the phase node terminal is connected to a high-side supply potential by the high-side transistor if the high-side transistor is turned on, and the phase node terminal is connected to a low-side supply potential by the low-side transistor if the low-side transistor is turned on;
providing the high-side output signal as an input signal to an inverter;
providing a floating supply voltage to a first supply terminal of the inverter;
providing a phase voltage generated at the phase node terminal as a floating reference voltage to a second supply terminal of the inverter;
generating an inverter output signal by the inverter based on the input signal, the floating supply voltage, and the floating reference voltage;
providing the inverter output signal to a cathode of a diode; and
comparing a measurement value at an anode of the diode with a threshold to generate a comparison result that indicates whether the measurement value satisfies the threshold,
wherein the measurement value is representative of the inverter output signal of the inverter, and
wherein the comparison result indicates whether or not the fault operating condition is present during an on-state interval during which the high-side output signal sets the high-side transistor in an on-state.

\* \* \* \* \*